(12) United States Patent
Yun et al.

(10) Patent No.: US 9,397,114 B2
(45) Date of Patent: Jul. 19, 2016

(54) METHODS OF FABRICATING THREE-DIMENSIONAL SEMICONDUCTOR MEMORY DEVICES

(75) Inventors: Jumi Yun, Pocheon-si (KR); Kwangmin Park, Seoul (KR); Dongchul Yoo, Seongnam-si (KR); Byong-hyun Jang, Suwon-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 849 days.

(21) Appl. No.: 13/475,023

(22) Filed: May 18, 2012

(65) Prior Publication Data
US 2012/0295409 A1 Nov. 22, 2012

(30) Foreign Application Priority Data
May 19, 2011 (KR) .......................... 10-2011-0047445

(51) Int. Cl.
*H01L 27/00* (2006.01)
*H01L 21/00* (2006.01)
*H01L 27/115* (2006.01)
*H01L 21/31* (2006.01)
*H01L 29/792* (2006.01)

(52) U.S. Cl.
CPC .......... *H01L 27/11582* (2013.01); *H01L 21/31* (2013.01); *H01L 29/7926* (2013.01)

(58) Field of Classification Search
CPC . H01L 27/1052; H01L 27/108; H01L 27/115; H01L 27/11521; H01L 27/11551; H01L 27/11556; H01L 27/11578; H01L 27/1156; H01L 21/336; H01L 21/31; H01L 21/28; H01L 21/302
See application file for complete search history.

(56) References Cited

U.S. PATENT DOCUMENTS

| 7,977,733 | B2 | 7/2011 | Shiino et al. | |
|---|---|---|---|---|
| 2009/0230450 | A1 | 9/2009 | Shiino et al. | |
| 2010/0120214 | A1* | 5/2010 | Park ................. | H01L 27/11578 438/287 |
| 2010/0140684 | A1* | 6/2010 | Ozawa .......................... | 257/324 |
| 2010/0140685 | A1* | 6/2010 | Kang et al. .................... | 257/324 |
| 2010/0155818 | A1 | 6/2010 | Cho et al. | |
| 2010/0181612 | A1* | 7/2010 | Kito et al. ..................... | 257/319 |
| 2010/0248439 | A1 | 9/2010 | Chung et al. | |

(Continued)

FOREIGN PATENT DOCUMENTS

| JP | 2009-224574 A | 10/2009 |
|---|---|---|
| KR | 10-2010-0107661 A | 10/2010 |
| KR | 10-2010-0113364 A | 10/2010 |

*Primary Examiner* — Marc Armand
*Assistant Examiner* — Quovaunda V Jefferson
(74) *Attorney, Agent, or Firm* — Harness, Dickey & Pierce

(57) ABSTRACT

Methods of fabricating three-dimensional semiconductor memory devices including forming a plate stack structure with insulating layers and sacrificial layers stacked alternatingly on a substrate, forming first and second trenches separating the plate stack structure into a plurality of mold structures, the first trench being between the second trenches, forming first vertical insulating separators in the first and second trenches, forming semiconductor patterns penetrating the mold structure and being spaced apart from the first and second trenches, removing the first vertical insulating separator from the second trench to expose the sacrificial layers, removing the sacrificial layers exposed by the second trench to form recess regions partially exposing the semiconductor patterns and the first vertical insulating separator, and forming conductive patterns in the recess regions.

15 Claims, 22 Drawing Sheets

(56) References Cited

U.S. PATENT DOCUMENTS

2011/0180941 A1* 7/2011 Hwang et al. ................. 257/786

2011/0312174 A1* 12/2011 Lee ................... H01L 27/11582
438/595

* cited by examiner

=== PAGE 1 ===

METHODS OF FABRICATING THREE-DIMENSIONAL SEMICONDUCTOR MEMORY DEVICES

CROSS-REFERENCE TO RELATED APPLICATION

This U.S. non-provisional patent application claims priority under 35 U.S.C. §119 to Korean Patent Application No. 10-2011-0047445, filed on May 19, 2011, in the Korean Intellectual Property Office (WO), the entire contents of which are incorporated herein by reference.

BACKGROUND OF THE INVENTION

1. Field

Example embodiments of the inventive concepts relate generally to methods of fabricating semiconductor memory devices. More particularly, example embodiments of the inventive concepts relate to methods of fabricating three dimensional semiconductor memory devices including vertically stacked memory cells.

2. Description of the Related Art

In typical two-dimensional or planar semiconductor memory devices, integration density is mainly determined by the area occupied by a unit memory cell, and integration density is greatly influenced by the level of a fine pattern forming technology. However, the extremely expensive process equipment needed to increase pattern fineness sets a practical limitation on increasing integration density of two-dimensional or planar semiconductor memory devices. Three-dimensional semiconductor memory devices having three-dimensionally arranged memory cells may increase integration density by stacking semiconductor devices vertically.

SUMMARY

Example embodiments of the inventive concepts may provide methods of fabricating three dimensional semiconductor memory devices with increased integration density and improved reliability.

According to example embodiments of the inventive concepts, a method of fabricating a three-dimensional semiconductor may include forming a plate stack structure including insulating layers and sacrificial layers stacked alternatingly on a substrate, forming first and second trenches separating the plate stack structure into a plurality of mold structures, the first trench being interposed between the second trenches, forming first vertical insulating separators in the first and second trenches, forming semiconductor patterns penetrating the mold structure and being spaced apart from the first and second trenches, removing the first vertical insulating separator from the second trench to expose the sacrificial layers, removing the sacrificial layers exposed by the second trench to form recess regions partially exposing the semiconductor patterns and the first vertical insulating separator, and forming conductive patterns in the recess regions.

According to at least one example embodiment, a method of fabricating a three-dimensional semiconductor includes forming a stack structure on a substrate, the stack structure including a plurality of insulating layers and a plurality of sacrificial layers, the insulating layers alternating with the sacrificial layers, forming at least one first trench and a plurality of second trenches, the first and second trenches separating the stack structure into a plurality of mold structures, the at least one first trench between the second trenches, forming first vertical insulating separators in the first and second trenches, forming semiconductor patterns penetrating the mold structure, the semiconductor patterns being spaced apart from the first and second trenches, removing the first vertical insulating separator from the second trench to expose the sacrificial layers; removing the sacrificial layers exposed by the second trench to form recess regions partially exposing the semiconductor patterns and the first vertical insulating separators, and forming conductive patterns in the recess regions.

According to at least one example embodiment, a method of fabricating a three-dimensional semiconductor includes forming a stack structure on a substrate, the stack structure including a plurality of insulating layers separating a plurality of sacrificial layers, forming a plurality of mold structures by removing portions of the stack structure, forming channel regions by removing portions of the mold structures, and thermally treating the channel regions.

According to at least one example embodiment, a method of fabricating a three-dimensional semiconductor includes forming a stack structure on a substrate, the stack structure including a plurality of insulating layers and a plurality of sacrificial layers, the insulating layers alternating with the sacrificial layers, and dividing the stack structure into a plurality of smaller stack structures prior to any high temperature thermal processing of the insulating layers.

BRIEF DESCRIPTION OF THE DRAWINGS

Example embodiments will be more clearly understood from the following brief description taken in conjunction with the accompanying drawings. FIGS. 1-26 represent non-limiting, example embodiments as described herein.

FIG. 1 is a schematic circuit diagram of three-dimensional semiconductor memory devices according to example embodiments of the inventive concepts;

FIGS. 2-10 are perspective diagrams illustrating methods of fabricating three-dimensional semiconductor memory devices according to example embodiments of the inventive concepts;

FIG. 12 is a perspective diagrams of three-dimensional semiconductor memory devices according to other example embodiments of the inventive concepts;

FIGS. 14 and 15 are perspective diagrams of three-dimensional semiconductor memory devices according to still other example embodiments of the inventive concepts;

FIGS. 16-23 are perspective diagrams of data storing layers according to example embodiments of the inventive concepts;

FIG. 24 is a block diagram illustrating memory systems including three-dimensional semiconductor memory devices according to example embodiments of the inventive concepts;

FIG. 25 is a block diagram illustrating memory cards including three-dimensional semiconductor memory devices according to example embodiments of the inventive concepts; and FIG. 26 is a block diagram illustrating information processing systems including three-dimensional semiconductor memory devices according to example embodiments of the inventive concepts.

Figure 1:
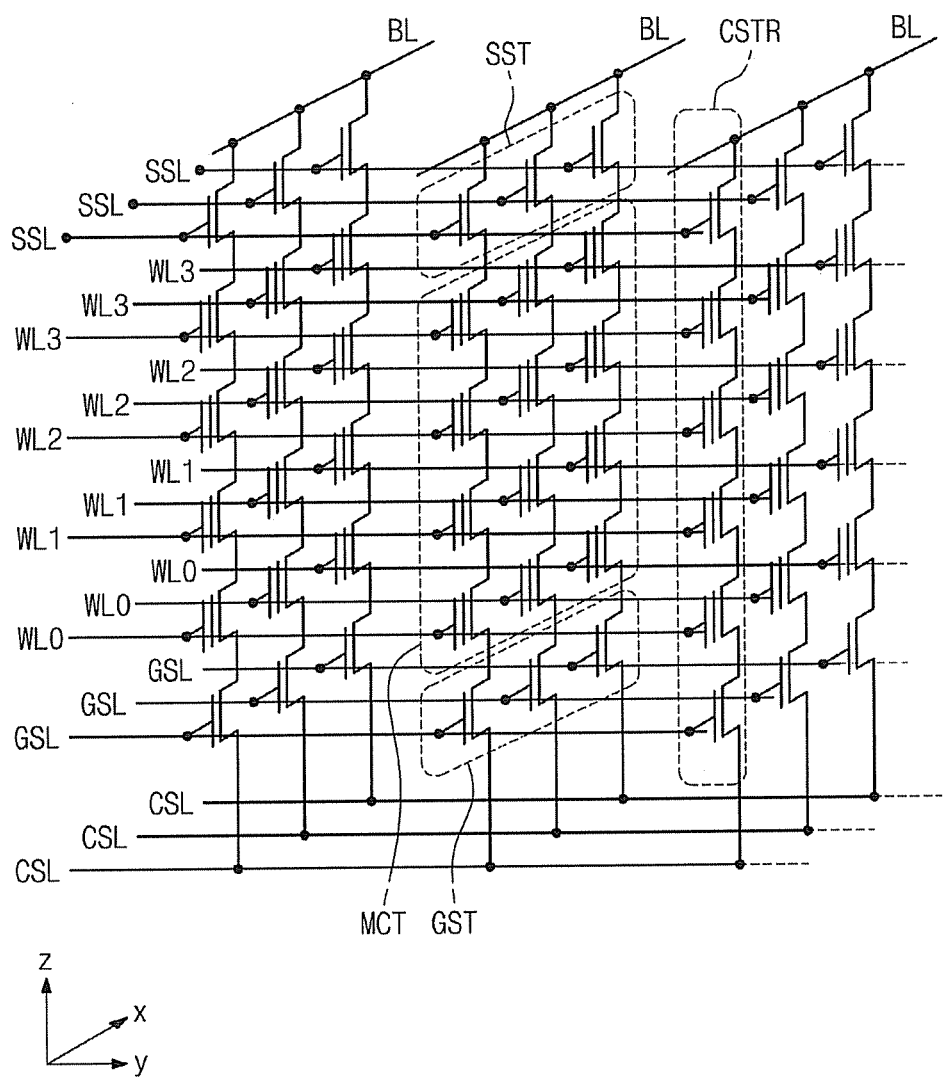

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are illustrated. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of the inventive concepts, a three-dimensional semiconductor memory device may include a cell array region, a peripheral circuit region, and a connection region. A plurality of memory cells may be in the cell array region. Bit lines and word lines may be in the cell array region to provide electric pathways for accessing to the memory cells. Peripheral circuits may be in the peripheral circuit region to operate the memory cells and read out data stored in the memory cells. For example, a word line driver, a sense amplifier, a row decoder, a column decoder, and a control circuit may be disposed in the peripheral circuit region. The connection region may be positioned between the cell array region and the peripheral circuit region, and an interconnection structure may be provided in the connection region to electrically connect the word lines with the peripheral circuits.

FIG. 1 is a schematic circuit diagram of a cell array region of three-dimensional semiconductor memory devices according to example embodiments of the inventive concepts. Referring to FIG. 1, a three-dimensional semiconductor memory device may include a cell array region, in which a common source line CSL, bit lines BL, and a plurality of cell strings CSTR are between the common source line CSL and the bit lines BL. The bit lines may be two-dimensionally arranged and a plurality of the cell strings CSTR may be connected in parallel to each of the bit lines BL. The cell strings CSTR may be connected in common to the common source line CSL. The plurality of the cell strings CSTR may be between the common source line CSL and one of the bit lines BL.

According to some example embodiments, the cell array region may include a plurality of two-dimensionally arranged common source lines CSL. According to some example embodiments, the common source lines CSL may be connected with each another and be in an equipotential state. According to other example embodiments, the common source lines CSL may be separated from each another such that they may be controlled independently. Each of the cell strings CSTR may include a ground selection transistor GST coupled to the common source line CSL, a string selection transistor SST coupled to the bit line BL, and a plurality of memory cell transistors MCT that may be between the ground and string selection transistors GST and SST. The ground selection transistor GST, the memory cell transistors MCT, and the string selection transistor SST may be connected in series.

Source regions of the ground selection transistors GST may be connected in common to the common source line CSL. At least one ground selection line GSL, a plurality of word lines WL0-WL3, and a plurality of string selection lines SSL may be between the common source line CSL and the bit lines BL to serve as gate electrodes of the ground selection transistor GST, the memory cell transistors MCT, and the string selection transistors SST, respectively. Each of the memory cell transistors MCT may include a data storage element and/or a data storing layer.

Figure 11A:
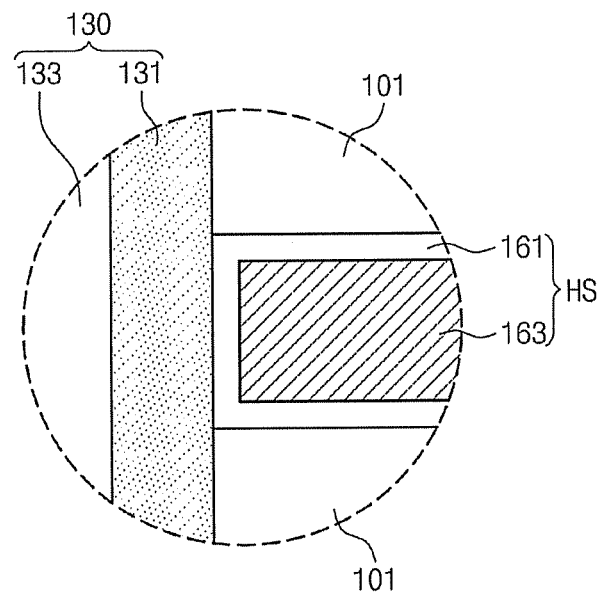
FIGS. 11A and 11B are enlarged sectional views of portions A and B, respectively, of FIG. 10.
Figure 11B:
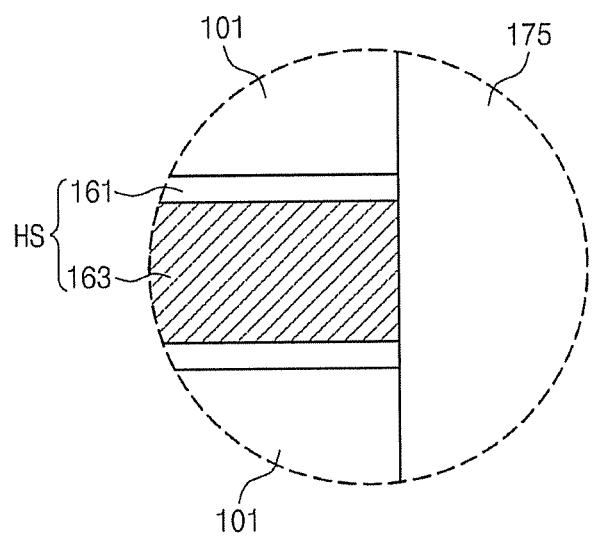
Figure 12:
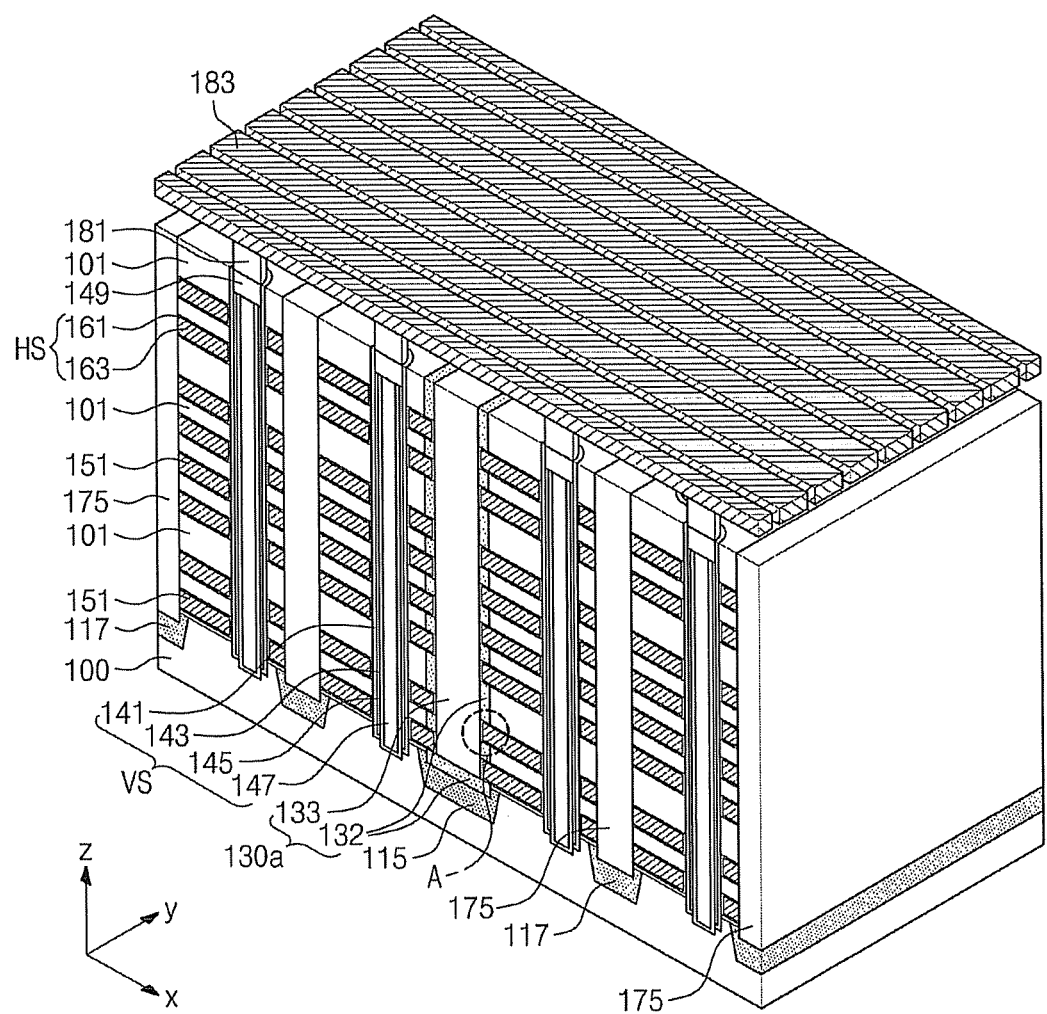
Figure 13A:
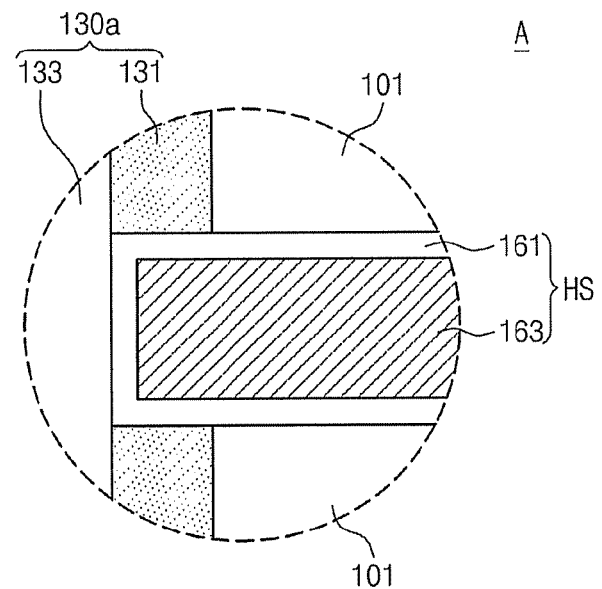
FIGS. 13A and 13B are enlarged sectional views of a portion A of FIG. 12.
Figure 13B:
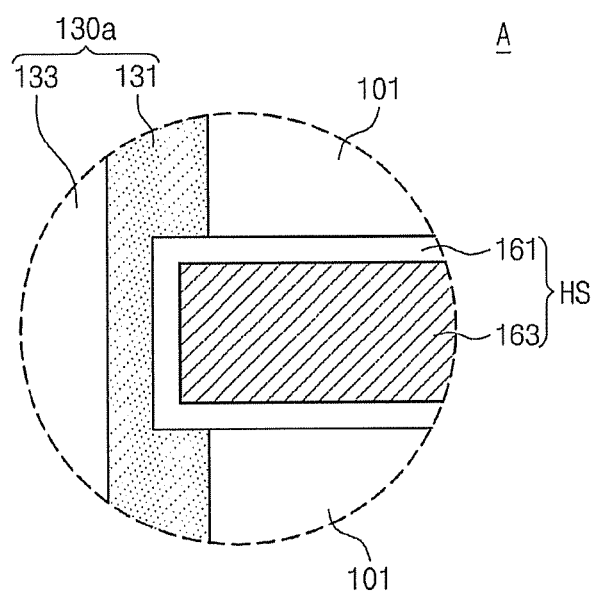
Figure 14:
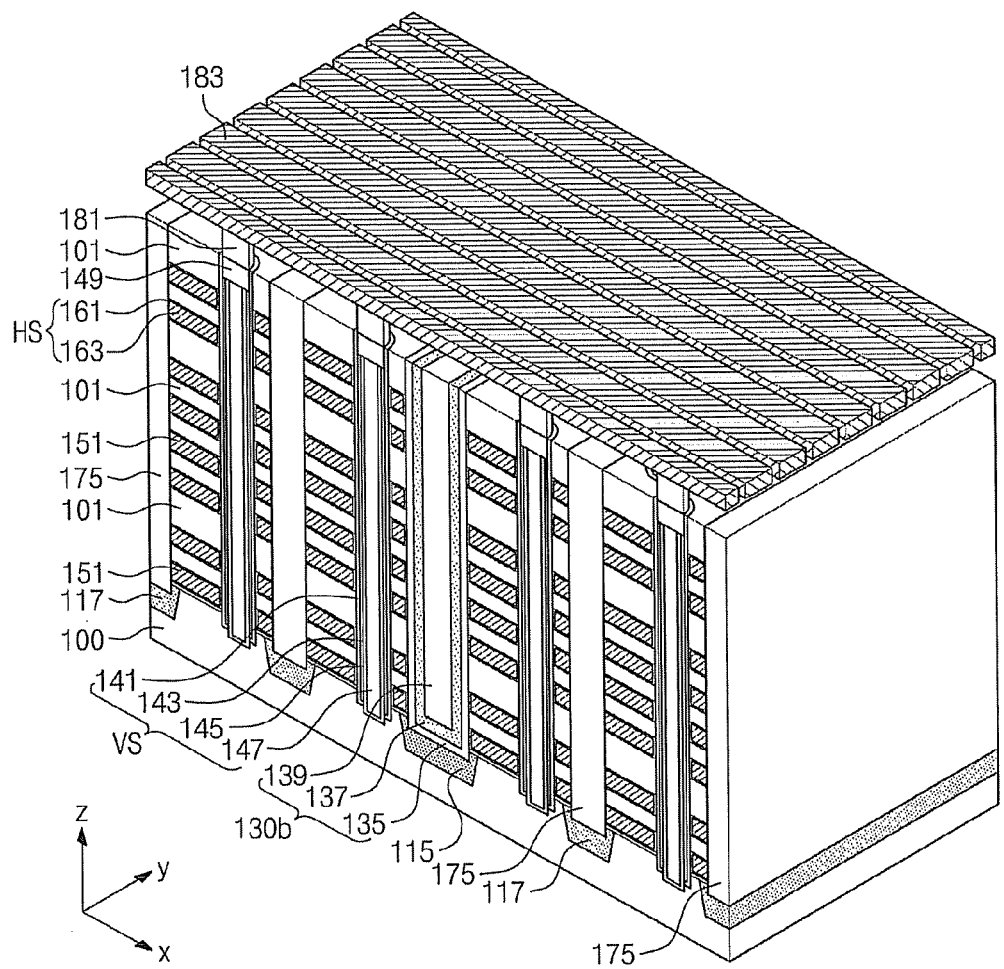
Figure 15:
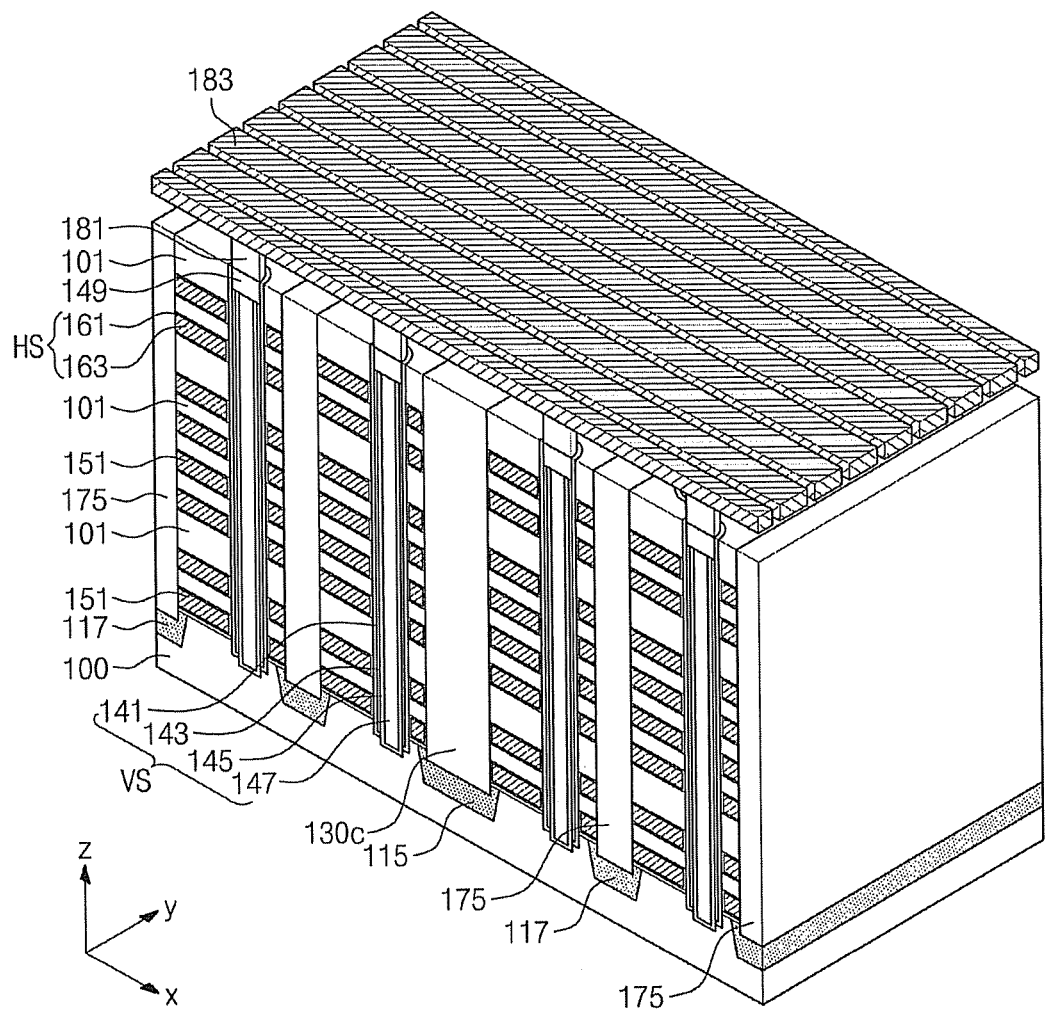
Figure 17:
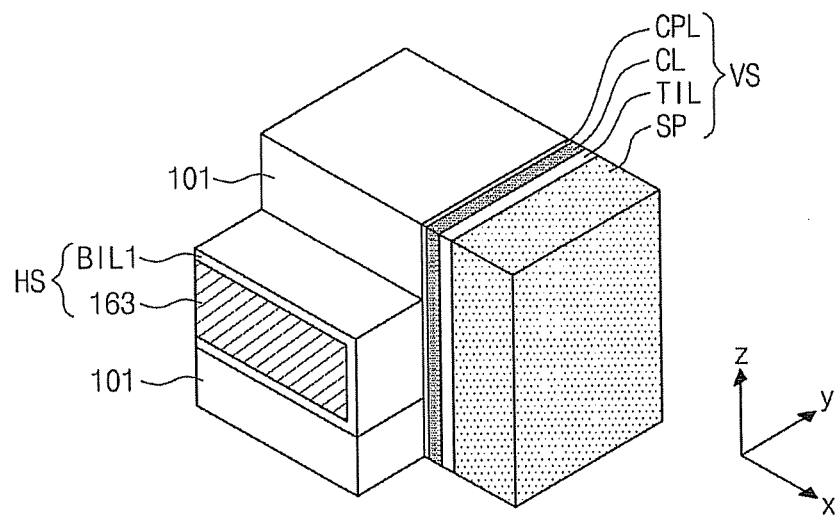

FIGS. 2-10 are perspective diagrams illustrating methods of fabricating three-dimensional semiconductor memory devices according to example embodiments of the inventive concepts. FIGS. 11A and 11B are enlarged sectional diagrams of portions A and B, respectively, of FIG. 10. FIG. 12 is a perspective diagram of three-dimensional semiconductor memory devices according to other example embodiments of the inventive concepts. FIGS. 13A and 13B are enlarged sectional diagrams of a portion A of FIG. 12. FIGS. 14 and 15 are perspective diagrams of three-dimensional semiconductor memory devices according to still other example embodiments of the inventive concepts.

Figure 2:
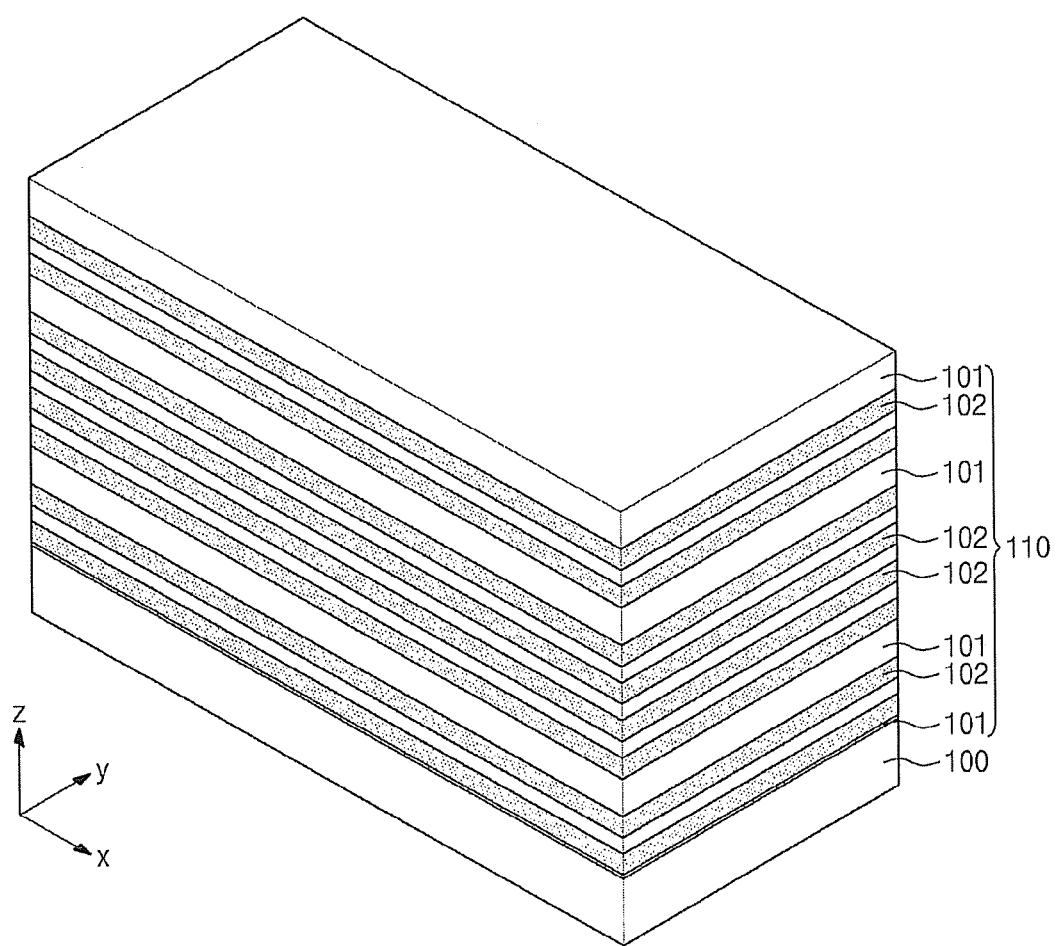

Referring to FIG. 2, a plate stack structure 110 may be formed on a substrate 100. The substrate 100 may include, for example, a semiconductor material, an insulating material, and/or a semiconductor or conductive material covered with an insulating layer. For example, the substrate 100 may be a silicon wafer. According to some example embodiments, the substrate 100 may include a well region (not illustrated) of a first conductivity type.

The plate stack structure 110 may include a plurality of insulating layers 101 and a plurality of sacrificial layers 102. The insulating layers 101 and the sacrificial layers 102 may be stacked in an alternating pattern, as illustrated in FIG. 2. The sacrificial layer 102 may be a material with etch selectivity to the insulating layers 101. For example, the insulating layers 101 may include a material that may be etched at a slower rate than a material of the sacrificial layer 102 during etching of the sacrificial layers 102. The etch selectivity may be quantitatively expressed as a ratio of an etch rate of a material of the sacrificial layer 102 to a material of the insulating layer 101. According to some example embodiments, the sacrificial layer 102 may be one or more materials that may provide an etch selectivity of 1:10 to 1:200 (e.g., 1:30 to 1:100) with respect to the insulating layer 101.

For example, the insulating layer 101 may include at least one of a silicon oxide or a silicon nitride, and the sacrificial layer 102 may include at least one, which may be selected to be different from the insulating layer 101, of silicon, a silicon oxide, a silicon carbide and/or a silicon nitride. The insulating layer 101 may be formed of a material with etch selectivity to the sacrificial layer 102. In the following description, for easier understanding of example embodiments of the inventive concepts, example embodiments will be described with respect to the insulating layer 101 of a silicon oxide and the sacrificial layer 102 of a silicon nitride. However, example embodiments of the inventive concepts are not limited to silicon oxide and silicon nitride, and each of the insulating layers 101 and the sacrificial layers 102 may not be limited to a type(s) of material.

According to some example embodiments, each of the sacrificial layers 102 may be formed with substantially the same thickness, as illustrated in FIG. 2. At least one of the insulating layers 101 may be formed to a different thickness from the others. For example, the lowermost layer of the insulating layers 101 may be thinner than the sacrificial layers 102, and the insulating layers 101 third from the bottom and third from the top may be thicker than the sacrificial layers 102, and the remaining layers of the insulating layers 101 may be thinner or thicker than the sacrificial layers 102. According to example embodiments, the insulating layer 101 may be variously modified to different thicknesses from those depicted in FIG. 2, and the plate stack structure 110 may be modified in terms of the number of layers therein.

The lowermost insulating layer may be the thinnest of the insulating layers 101 of the plate stack structure 110. According to some example embodiments, the lowermost insulating layer 101 may be a silicon oxide formed by thermal oxidation and may reduce crystal defects in a surface of the substrate 100 and relieve a stress between the plate stack structure 110 and the substrate 100. For example, the lowermost insulating may be formed to a thickness of about 10 angstroms to 100 angstroms. In the case that the plate stack structure 110 may include two or more different types of materials, a mechanical stress may occur in the plate stack structure 110, due to differences in lattice constants and/or thermal expansion coefficients. The stress may be induced by a subsequent thermal process, and the plate stack structure 110 may be deformed.

Figure 3:
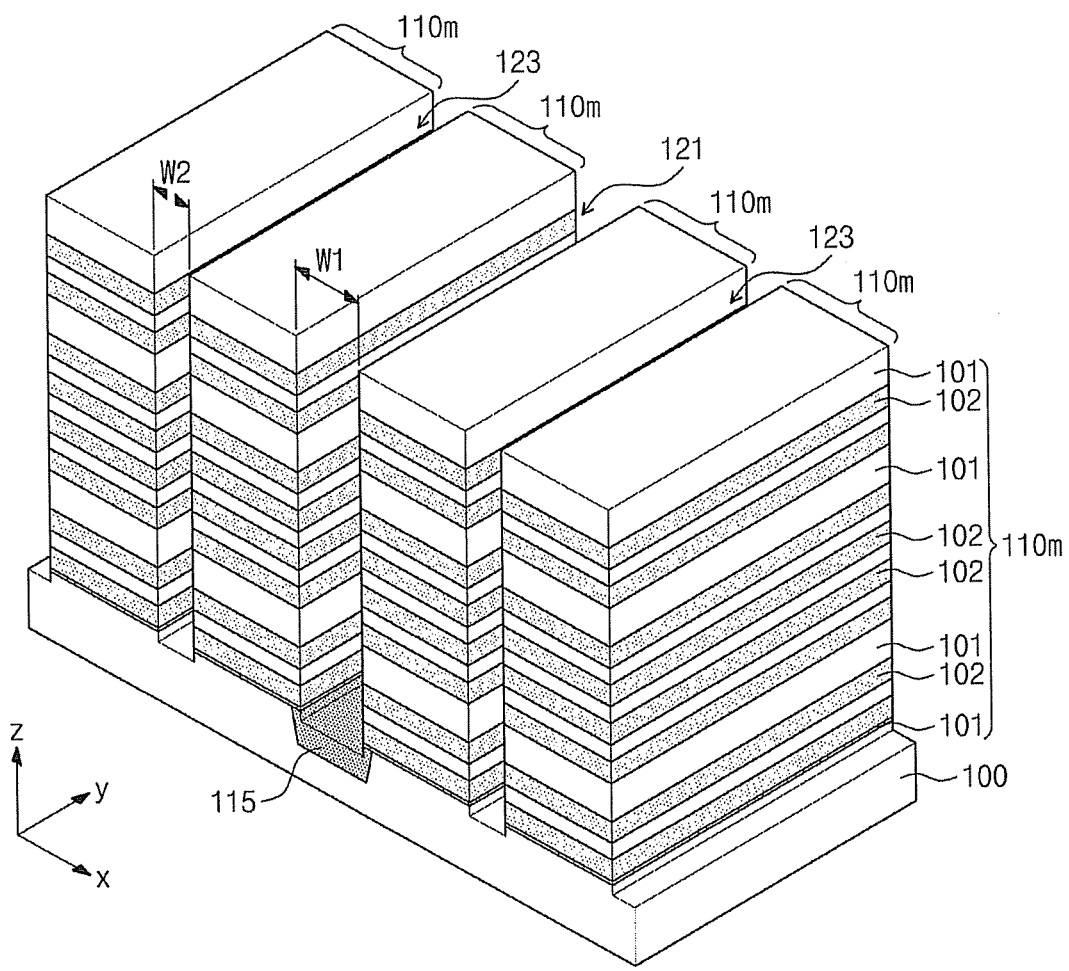

According to example embodiments of the inventive concepts, as illustrated in FIG. 3, the plate stack structure 110 may be separated into a plurality of mold structures 110m, before performing thermal processing. As the result of this separation, it may be possible to prevent the mold structures 110m from being deformed. According to some example embodiments, a horizontal width or x-directional width of the mold structure 110m may be substantially the same as that of a conductive pattern (depicted by the reference numeral 163 of FIG. 10), which may be stacked on the substrate 100.

Referring to FIG. 3, the plate stack structure 110 may be patterned to form the mold structures 110m separated from each other. The formation of the mold structures 110m may include forming first trenches 121 and second trenches 123 to penetrate the plate stack structure 110 and expose the substrate 100. The formation of the first and second trenches 121 and 123 may include, for example, forming a mask pattern on the plate stack structure 110 and anisotropically etching the insulating layers 101 and the sacrificial layers 102 using the mask pattern as an etch mask to expose the substrate 100. Each of the mold structures 110m may be formed to have a first sidewall and a second sidewall facing each other.

The first and second trenches 121 and 123 may be formed to extend along a y-direction and expose a top surface of the substrate 100. In plan view, the first and second trenches 121 and 123 may be parallel to each other. According to some example embodiments, the substrate 100 may be over-etched during the anisotropic etch and may be recessed below the first and second trenches 121 and 123. Because the plate stack structure 110 may include two or more different types of materials, sidewalls of the first and second trenches 121 and 123 may be sloped with respect to the top surface of the substrate 100. For example, the first and second trenches 121 and 123 may be downwardly tapered.

According to some example embodiments, the first trench 121 may be formed between a pair of the second trenches 123 disposed adjacent to each other. The mold structures 110m may be provided between the second trenches 123 and/or between the first trench 121 and the second trench 123. X-directional widths of the first and second trenches 121 and 123 may be a first width W1 and a second width W2, respectively. According to some example embodiments, the first width W1 of the first trench 121 may differ from the second width W2 of the second trench 123. For example, the first width W1 of the first trench 121 may be greater than the second width W2 of the second trench 123. Example embodiments of the inventive concepts may not be limited thereto; for example, in other example embodiments, the first width W1 may be less than or equivalent to the second width W2. In the present specification, it may be understood that the x-directional width may be measured along a shorter side of the first or second trench 121 or 123.

According to some example embodiments, a first doped region 115 may be formed in the substrate 100 below the first trench 121 after the formation of the mold structures 110m. The formation of the first doped region 115 may include forming a mask pattern (not illustrated) to selectively expose the first trench 121 and doping the exposed portion of the substrate 100. According to other example embodiments, the first doped region 115 may be formed in the substrate 100 below both of the first and second trenches 121 and 123. In still other example embodiments, the first doped region 115 may be locally formed in the substrate 100 before the formation of the plate stack structure 110, and in this case, the first trench 121 may be formed to expose the first doped region 115 previously formed in the substrate 100.

According to some example embodiments, the first doped region 115 may be doped with dopants of the same conductivity type (e.g., a first conductivity type) as the substrate 100 and/or the well region (not illustrated). In this case, the first doped region 115 may have a doping concentration higher than the well region (not illustrated). A stable electric signal may be supplied to the substrate 100 and/or the well region via the first doped region 115. However, example embodiments of the inventive concepts may not be limited thereto. According to other example embodiments, the first doped region 115 may be doped with dopants of a second conductivity type. One of the first and second conductivity types may be n-type and the other p-type. As a result, the first doped region 115 may form a pn junction along with the substrate 100 and/or the well region. According to still other example embodiments, the formation of the first doped region 115 may be omitted.

Figure 4:
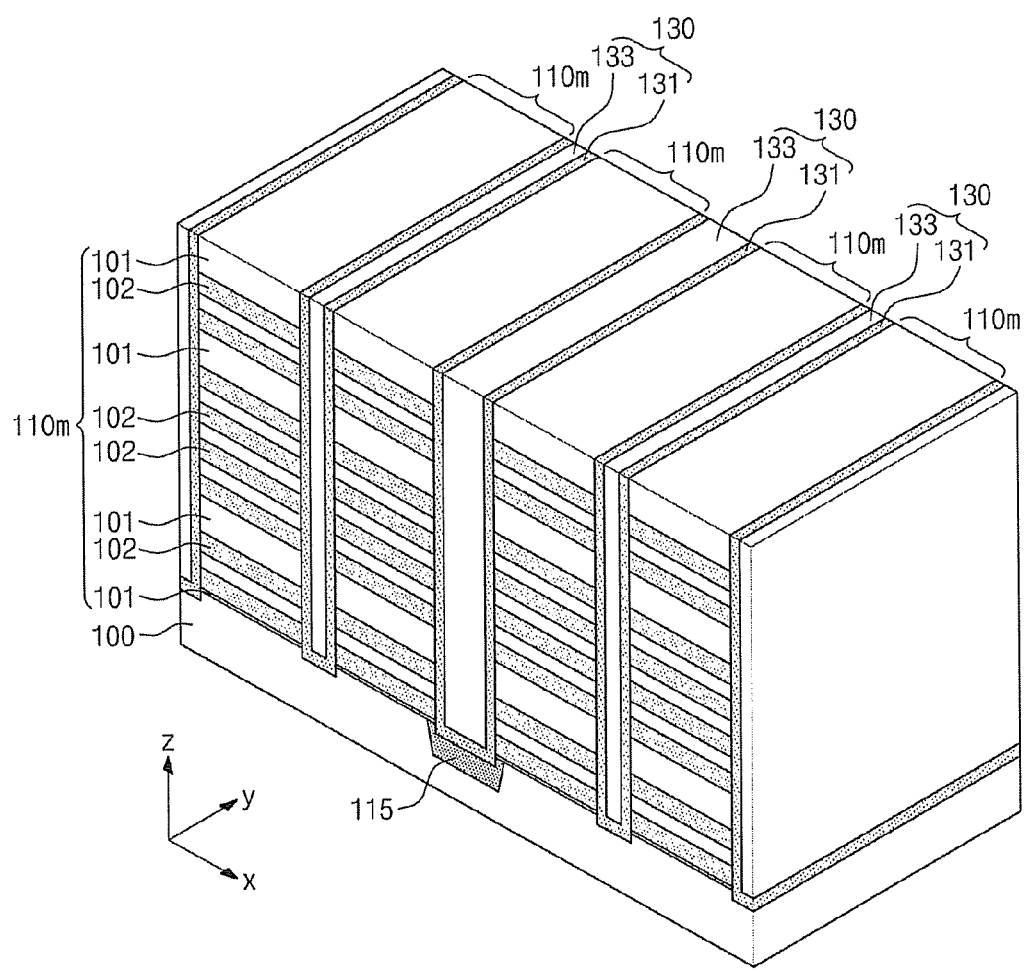

Referring to FIG. 4, first vertical insulating separators 130 may be formed to fill the first and second trenches 121 and 123. The first vertical insulating separator 130 may be formed to be in contact with sidewalls of the insulating layers 101 and the sacrificial layers 102 exposed by the first and second trenches 121 and 123. According to some example embodiments, the first vertical insulating separator 130 may include an etch stop layer 131 and an insulating gap-fill layer 133. The etch stop layer 131 may be formed to conformally cover inner walls of the first and second trenches 121 and 123, such that the etch stop layer 131 may be in direct contact with the sidewalls of the insulating layers 101 and the sacrificial layers 102 exposed by the first and second trenches 121 and 123. The formation of the first vertical insulating separators 130 may include depositing a first separation layer to fill the first and second trenches 121 and 123, and planarizing the first separation layer, for example, using a planarization technique to expose a top surface of the mold structures 110m. For example, a chemical-mechanical polishing technique and/or an etch-back technique, According to some example embodiments, the deposition of the first separation layer may include forming the etch stop layer 131 to define an empty region in the first and second trenches 121 and 123 and may fill the empty region with the insulating gap-fill layer 133. The etch stop layer 131 may be formed of a different material from the insulating layers 101 and the sacrificial layers 102. The etch stop layer 131 may be formed of an insulating material with etch selectivity to the insulating layers 101 and the sacrificial layers 102. According to other example embodiments, the etch stop layer 131 may be formed of the same material as the sacrificial layers 102. The etch stop layer 131 may be formed of at least one material which may be different from the insulating layer 101. For example, the material of the etch stop layer 131 may be silicon, a silicon oxide, a silicon carbide and/or a silicon nitride. The insulating gap-fill layer 133 may be formed of at least one material which may be different from the etch stop layer 131. For example, the material of the gap-fill layer 133 may be a spin-on-glass (SOG) insulating layer, a silicon layer, a silicon oxide layer, a silicon carbide layer, and/or a silicon nitride layer.

According to certain example embodiments, the first vertical insulating separator 130 may be modified to include three or more layers sequentially filling the first and second trenches 121 and 123. For example, a plurality of layers 135, 137 and 139 sequentially stacked in the first and second trenches 121 and 123 may form a first vertical insulating separator 130b, as illustrated in FIG. 14. The layer 135 that may be in direct contact with the mold structure 110m formed of a material with etch selectivity to the insulating layers 101 and the sacrificial layers 102 of the mold structure 110m. According to certain example embodiments, the first vertical insulating separator 130 may be modified to include a single layer. For example, as illustrated in FIG. 15, a first vertical insulating separator 130c may be a single layer, which may be formed of, for example, the same material as the insulating layers 101 of the mold structure 110m.

Figure 5:
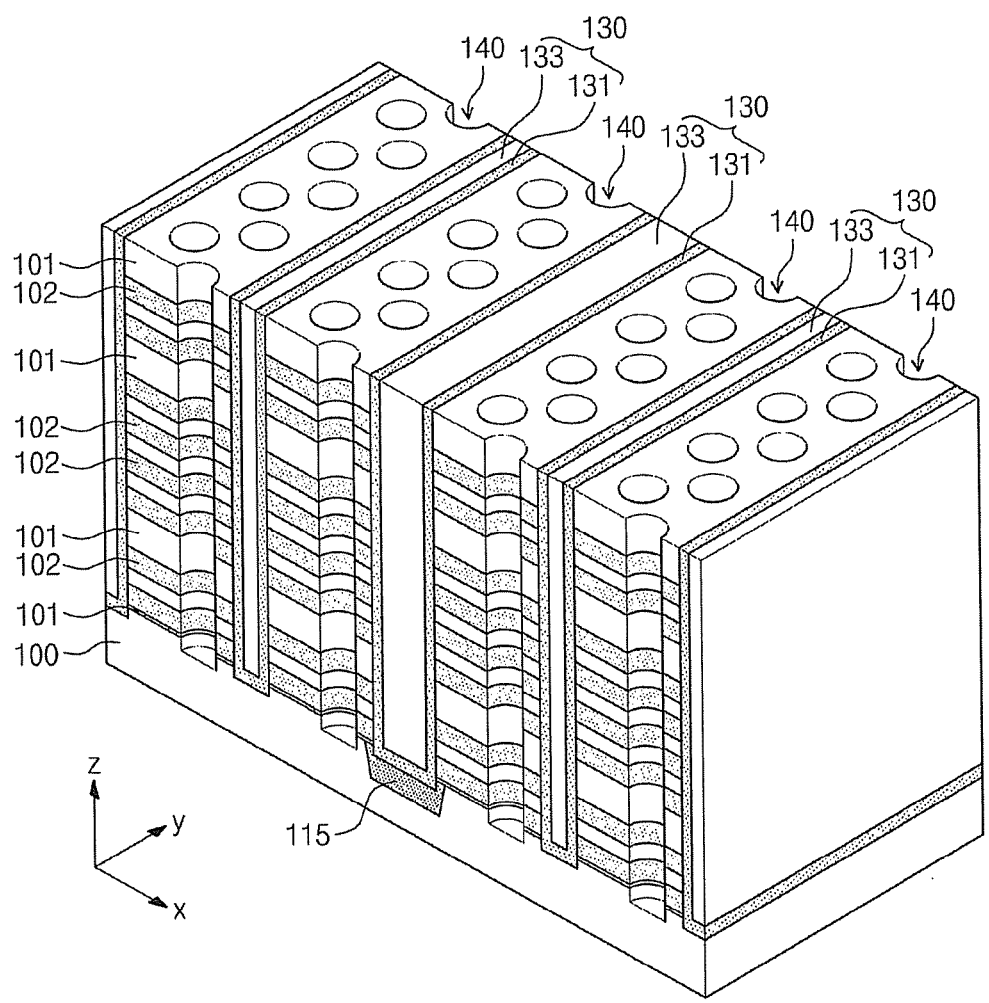

Referring to FIG. 5, openings 140 may be formed to penetrate the mold structure 110m. According to some example embodiments, each of the openings 140 may be a hole with a circular horizontal section. Each of the openings 140 may be formed with a shape in which its depth may be at least five times its width (e.g., an aspect ratio of 5). According to some example embodiments, the openings 140 may be two-dimensionally formed on the top surface (e.g., the xy plane) of the substrate 100. For example, each opening 140 may be an isolated region spaced apart from other openings 140 along x and y directions. According to some example embodiments, the openings 140 may be arranged along the y-axis in a zigzag manner. A distance between the openings 140 disposed adjacent to each other may be less than or equivalent to a width of the opening 140. A density of the openings 140 may be increased due to the zigzagged arrangement of the openings 140.

The formation of the openings 140 may include, for example, forming a mask pattern on the mold structure 110m that may define positions of the openings 140 and anisotropically etching the mold structure 110m using the mask pattern as an etch mask. Because the mold structure 110m may include two or more different types of materials, sidewalls in the openings 140 may be sloped with respect to the top surface of the substrate 100. For example, the openings 140 may be downwardly tapered. According to some example embodiments, the openings 140 may expose the top surface of the substrate 100, as illustrated in FIG. 5. The substrate 100 below the openings 140 may be recessed due to over-etching during an anisotropic etch of the mold structure 110m. The substrate 100 may include two-dimensionally arranged dents, the sidewalls of which may be aligned with those of the openings 140. Due to the presence of the dents, a vertical structure VS may have structural stability (see FIG. 6).

Figure 6:
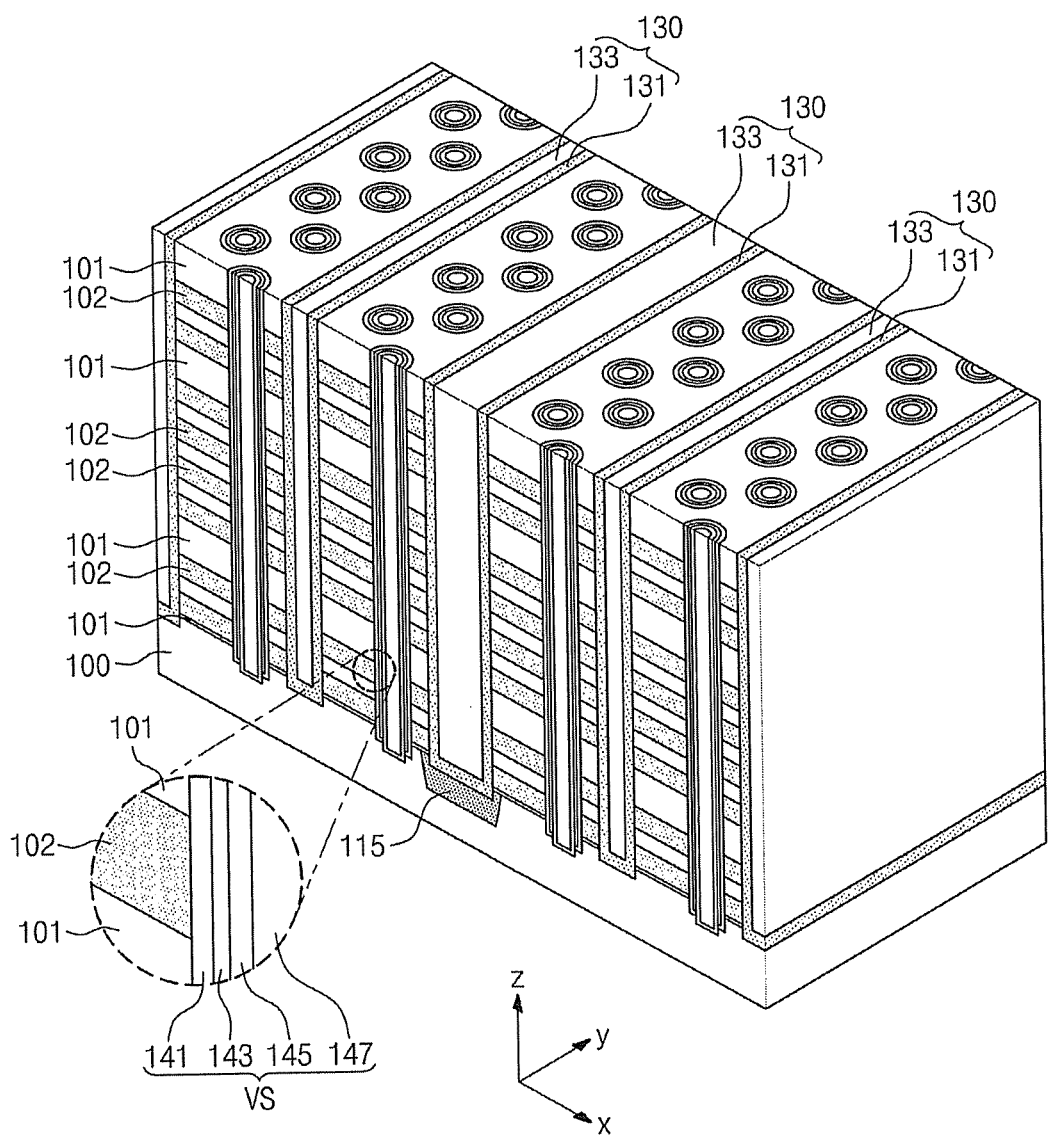

Referring to FIG. 6, vertical structures VS may be formed in the openings 140. Each of the vertical structures VS may include at least one semiconductor pattern provided in the opening 140. According to some example embodiments, the vertical structure VS may include at least one semiconductor pattern and a vertical insulating pattern 141 that may be interposed between the mold structure 110m and the semiconductor pattern. In other example embodiments, the vertical structure VS may be formed without the vertical insulating pattern such that the semiconductor pattern may be in direct contact with the sidewall of the mold structure 110m. A gap-filling layer 147 may be formed to fill an empty cylindrical region defined by the semiconductor pattern.

The formation of the vertical structure VS may include forming a vertical layer to conformally cover the mold structure 110m with the openings 140, forming a semiconductor spacer 143 to cover an inner wall of the vertical layer, and anisotropically etching the vertical layer to expose the top surface of the substrate 100 below the opening 140. The vertical layer may include one or more layers. For example, the vertical layer may include at least one of layers serving as a memory element of a charge trap type nonvolatile memory transistor. According to some example embodiments, the formation of the vertical layer may include a high temperature process that may be performed under a high temperature environment, such as a thermal oxidation process. According to example embodiments of the inventive concepts, despite the high temperature process, a deformation of the mold structure 110m may be reduced or effectively prevented from occurring, because the high temperature process may be performed after separating the plate stack structure 110 into the mold structures 110m. Devices according to example embodiments of the inventive concepts may be variously classified according to types of layers constituting the vertical layer.

The formation of the semiconductor spacer 143 may include forming a semiconductor layer (not illustrated) to conformally cover the resultant structure provided with the vertical layer and anisotropically etching the semiconductor layer to expose the vertical layer. According to some example embodiments, the semiconductor layer may be a polysilicon layer formed by, for example, an atomic layer deposition (ALD) and/or a chemical vapor deposition (CVD). A thickness of the semiconductor layer may be from about 1/50 to 1/5 of a width of the openings 140. According to other example embodiments, the semiconductor layer may be formed using an epitaxial technique. According example embodiments, the semiconductor layer may be an amorphous silicon layer, a single-crystalline silicon layer, an organic semiconductor layer, and/or carbon nano structures.

The semiconductor spacer 143 may be formed in a cylindrical shape with open ends in the opening 140 that may be provided with the vertical layer. According to some example embodiments, the semiconductor spacer 143 may be used as an etch mask to prevent the vertical layer from being damaged or reduce damage. An anisotropic etch of the vertical layer may be performed using the semiconductor spacer 143 as an etch mask. The vertical insulating pattern 141 may be formed in a cylindrical shape with open ends and the semiconductor spacer 143 may be formed on an inner wall of the vertical insulating pattern 141 to expose the substrate 100. The top surface of the substrate 100 that may be exposed by the semiconductor spacer 143 may be recessed by over-etching during the anisotropic etching of the vertical layer.

Because the semiconductor spacer 143 may be used as the etch mask during the anisotropic etching of the vertical layer, a portion of the vertical layer located below the semiconductor spacer 143 may not be etched, such that the vertical insulating pattern 141 may include a bottom portion interposed between a bottom surface of the semiconductor spacer 143 and a top surface of the substrate 100. A top surface of the mold structure 110m may be exposed by the anisotropic etching of the semiconductor layer and the vertical layer. This means that each of the vertical insulating patterns 141 and each of the semiconductor spacers 143 may be localized to corresponding openings 140. The vertical insulating patterns 141 and the semiconductor spacers 143 may be two-dimensionally arranged on the top surface (i.e., the xy plane) of the substrate 100.

The formation of the semiconductor pattern may further include forming a semiconductor body portion 145 and the gap-fill layer 147 to sequentially fill the openings 140 that may be provided with the vertical insulating pattern 141 and the semiconductor spacer 143. The semiconductor pattern may include the semiconductor spacer 143 and the semiconductor body portion 145. The semiconductor body portion 145 may be, for example, a polysilicon layer formed by ALD and/or CVD. According to some example embodiments, the semiconductor body portion 145 may be conformally formed to a thickness that does not completely fill the openings 140. The semiconductor body portion 145 may be formed in a pipe shape, a hollow cylindrical shape, or a cup shape.

The gap-filling layer 147 may be formed to fill an empty space of the opening 140 that may be defined by the semiconductor body portion 145. For example, the gap-filling layer 147 may be an insulating layer that may be formed by, for example, a spin-on-glass technique and/or may be a silicon oxide. According to some example embodiments, a hydrogen annealing step under a gas atmosphere that may contain hydrogen and/or heavy hydrogen may be performed to thermally treat the resultant structure that may be provided with the semiconductor body portion 145 (e.g., before the formation of the gap-filling layer 147). Crystal defects in the semiconductor spacer 143 and the semiconductor body portion 145 may be cured and/or reduced during the hydrogen annealing.

According to other example embodiments, the semiconductor body portion 145 may be formed to fill the openings 140 that may be provided with the semiconductor spacer 143 and the formation of the gap-filling layer 147 may be omitted. In this case, the semiconductor body portion 145 may be shaped like a solid cylinder filling the opening 140. According to certain example embodiments, the semiconductor spacer 143 and the semiconductor body portion 145 may include a layer of, for example, silicon, germanium, and/or a compound thereof. The semiconductor spacer 143 and the semiconductor body portion 145 may be a doped semiconductor and/or an intrinsic semiconductor. The semiconductor spacer 143 and the semiconductor body portion 145 may be a polycrystalline, amorphous, and/or single-crystalline structure.

The semiconductor spacer 143 and the semiconductor body portion 145 may be formed using, for example, CVD and/or ALD. As the result of the use of deposition technique, the semiconductor spacer 143 may be of a different crystal structure from the semiconductor body portion 145, and this difference in crystal structure form a discontinuous interface between the semiconductor spacer 143 and the semiconductor body portion 145. According to other example embodiments, the formation of the semiconductor body portion 145 may include depositing an amorphous and/or polycrystalline silicon layer and thermally treating the deposited silicon layer to transform the silicon layer into a single-crystalline structure (for example, using a laser annealing technique). According to still other example embodiments, an epitaxial process may be performed using the substrate 100 that may be exposed by the openings 140 as a seed layer in order to selectively form the semiconductor body portion 145 in the opening 140.

Figure 7:
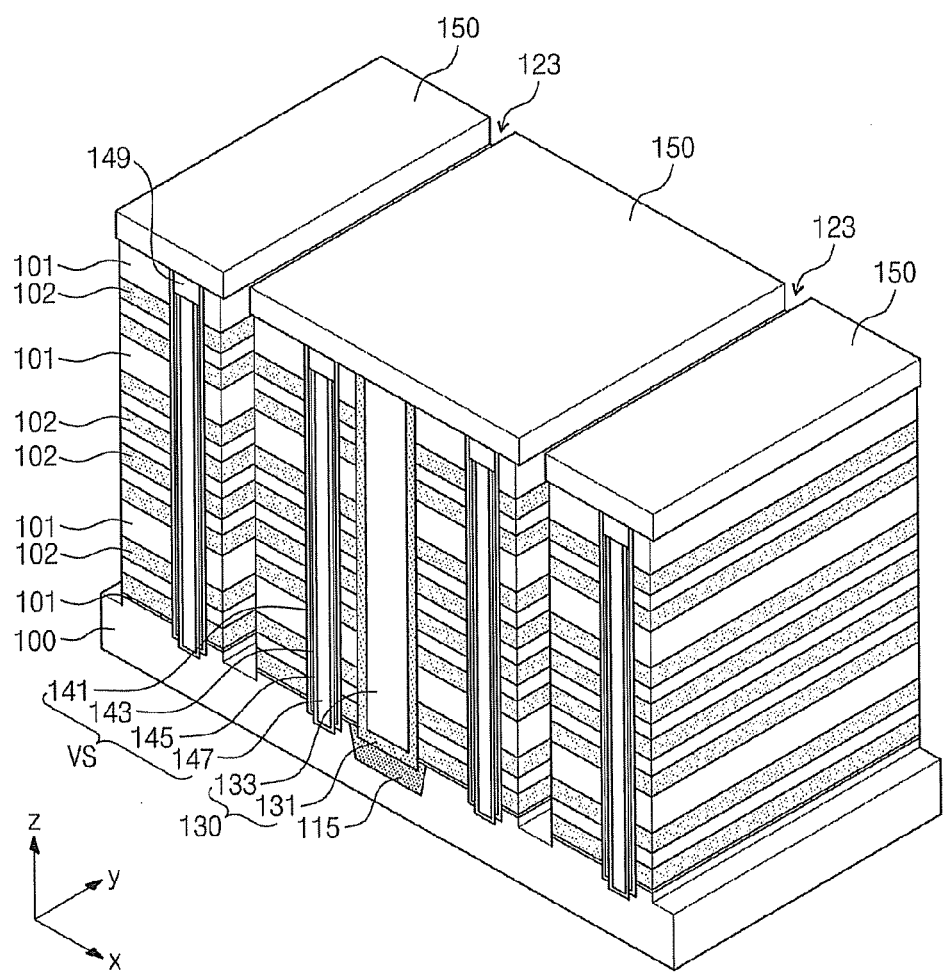

According to some example embodiments, an upper doped region 149 may be formed in an uppermost portion of the semiconductor pattern 143 and/or 145, as illustrated in FIG. 7. The upper doped region 149 may be doped with impurities of a different conductivity type from the remaining portion of the semiconductor pattern 143 and 145, and the upper doped region 149 and the remaining portion of the semiconductor pattern 143 and 145 may constitute a rectifying device, for example, a diode.

Referring to FIG. 7, the first vertical insulating separators 130 may be removed from the second trenches 123 to expose one sidewall of each mold structure 110m. For example, the removal of the first vertical insulating separator 130 may include forming a mask pattern 150 on the mold structures 110m to cover some of the first vertical insulating separator 130 that may be disposed in the first trenches 121, removing the insulating gap-fill layer 133 from the second trenches 123 using the mask pattern 150 as an etch mask to form the etch stop layer 131, and removing the exposed etch stop layer 131 to expose the sidewall of the mold structure 110m. The mask pattern 150 may be removed after removing the first vertical insulating separators 130 from the second trenches 123.

Figure 8:
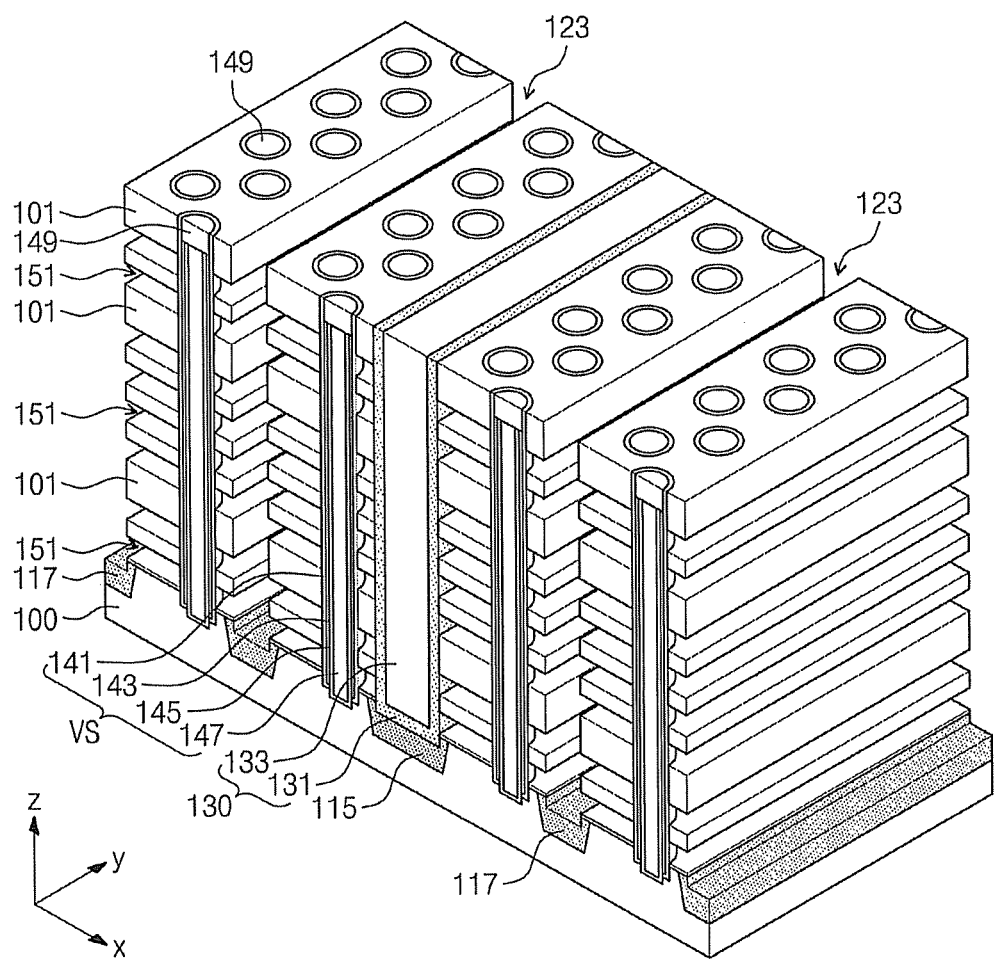

Referring to FIG. 8, the sacrificial layers 102 may be selectively removed to form recess regions 151 between the insulating layers 101. The formation of the recess regions 151 may include etching the sacrificial layers 102 exposed by the second trench 123. According to some example embodiments, the recess regions 151 may be formed by continuously performing or using the process of removing the etch stop layer 131 from the second trenches 123. The formation of the recess regions 151 may include horizontally etching the sacrificial layers 102 using an etch recipe providing etch selectivity between the sacrificial layers 102, the insulating layers 101 and the vertical insulating patterns 141. For example, in the case that the sacrificial layers 102 may be formed of silicon nitride and the insulating layers 101 may be formed of silicon oxide, the horizontal etching, of the sacrificial layers 102 may be performed using a selective etchant containing phosphoric acid.

The recess region 151 may horizontally extend between the insulating layers 101 from the second trench 123 and may partially expose a sidewall of the vertical insulating pattern 141. According to example embodiments of the inventive concepts, vertical thicknesses of the recess regions 151 may be mainly determined by deposition thicknesses of the sacrificial layers 102 described with reference to FIG. 2. According to some example embodiments, the recess regions 151 may be formed to expose a portion of the etch stop layer 131 of the first vertical insulating separator 130. For example, an outer boundary of the recess region 151 may be confined by the insulating layers 101, the first vertical insulating separator 130, and the second trench 123. An internal boundary of the recess region 151 may be defined by the vertical structure VS vertically penetrating the recess region 151.

According to other example embodiments, when the sacrificial layers 102 are removed to form the recess regions 151, portions of the etch stop layer 131 adjacent to the sacrificial layers 102 may be locally etched to expose portions of the insulating gap-fill layer 133, as illustrated in FIGS. 12 and 13A. According to yet other example embodiments, as illustrated in FIG. 13B, the etch of the sacrificial layers 102 may be controlled in such a way that a thickness of a portion of the etch stop layer 131 adjacent to the recess region 151 may be less than another portion of the etch stop layer 131 adjacent to the insulating layer 101.

A second doped region 117 may be formed in the substrate 100 exposed by the second trench 123. The second doped region 117 may be doped with dopants of the second conductivity type. Alternatively, the second doped region 117 may be the same conductivity type as the substrate 100. The second doped region 117 may be formed before or after the formation of the recess regions 151, or after a subsequent step of forming a gate electrode in the recess region 151. According to some example embodiments, the second doped regions 117 may be connected to each other and may be in an equipotential state. In other example embodiments, the second doped regions 117 may be separated from each other in order to have electric potentials different from each other. The second doped region 117 may serve as the common source line CSL of FIG. 1.

Figure 9:
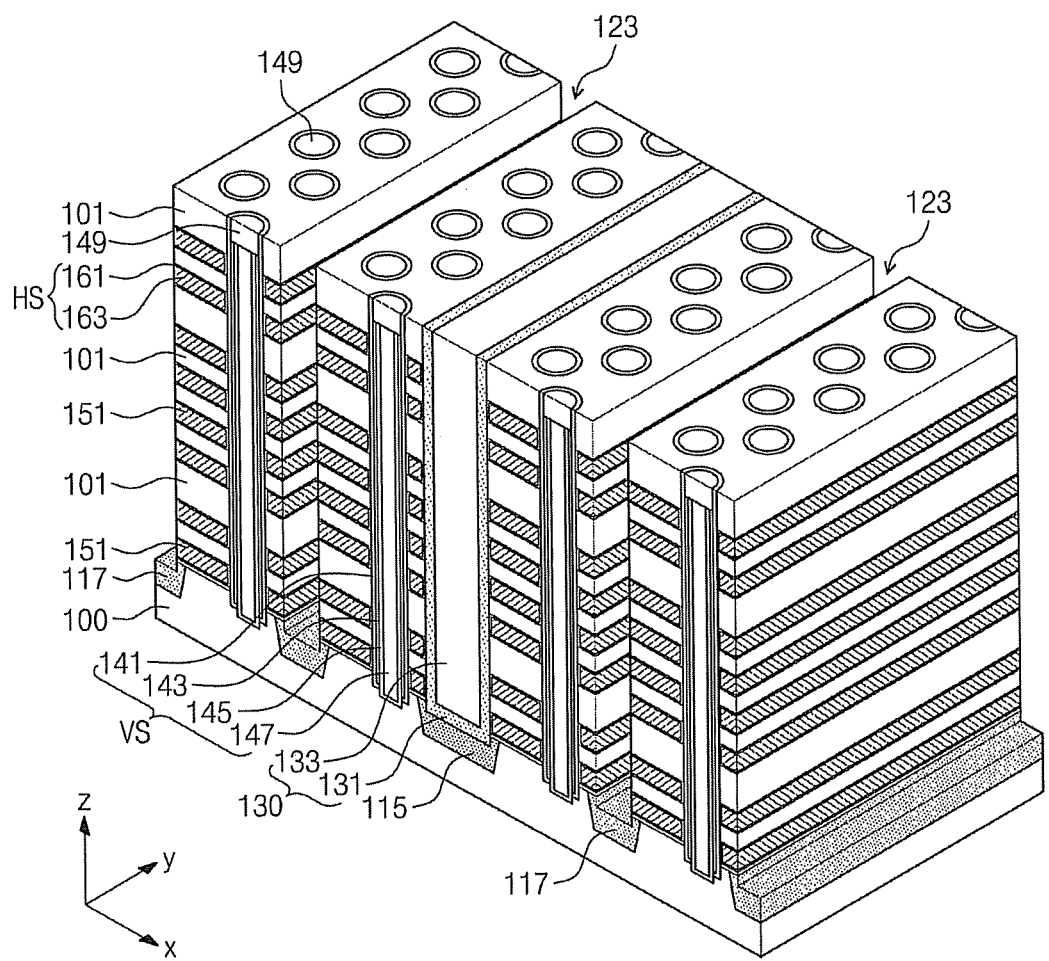

Referring to FIG. 9, horizontal structures HS may be formed in the recess regions 151. According to some example embodiments, the horizontal structure HS may include a horizontal insulating pattern 161 covering an inner wall of the recess region 151 and a conductive pattern 163 filling the remaining space of the recess region 151. The formation of the horizontal structures HS may include sequentially forming a horizontal layer and a conductive layer to fill the recess regions 151 and removing the conductive layer from the second trenches 123 such that the conductive patterns 163 remain in the recess regions 151.

The horizontal layer and the horizontal insulating pattern 161 may include a single layer or multi layers, similar to the vertical layer. According to some example embodiments, the horizontal insulating pattern 161 may include a blocking insulating layer that may constitute the memory element of the charge trap type nonvolatile memory transistor. Example embodiments of the inventive concepts may be variously classified according to type of layers constituting the vertical layer and the horizontal insulating pattern 161. According to some example embodiments, the horizontal insulating pattern 161 may be formed to be in contact with the vertical insulating pattern 141 and a portion of the first vertical insulating separator 130. For example, the horizontal insulating pattern 161 may be in direct contact with the etch stop layer 131 in the first trench 121, as illustrated in FIGS. 11A and 13B. According to at least one example embodiment, the horizontal insulating pattern 161 may be in direct contact with the insulating gap-fill layer 133 in the first trench 121, as illustrated in FIG. 13A.

The conductive layer may be formed to fill the recess regions 151 provided with the horizontal layer. The second trenches 123 may be fully or partially filled with the conductive layer. The conductive layer may include, for example, at least one of a doped silicon layer, a metal layer, a metal nitride layer and a metal silicide layer. For example, the conductive layer may be formed of a tantalum nitride or tungsten.

According to some example embodiments, the conductive layer may be formed using a deposition technique providing, for example, excellent and/or improved step coverage property (e.g., a CVD and/or ALD technique). As a result, the conductive layer may fill the recess regions 151 and may be conformally formed in the second trench 123. For example, the conductive layer may be formed to a thickness that may be greater than half of a vertical thickness of the recess region 151. In the case that a horizontal width of the second trench 123 may be greater than a vertical thickness of the recess region 151, the conductive layer may partially fill the second trench 123 and may define an empty region located at a center portion of the second trench 123. The empty region may have an upwardly open structure. In this case, the formation of the conductive pattern 163 may include removing the conductive layer from the second trench 123 using an isotropic etch process. According to other example embodiments, the conductive layer may be formed to fill the second trench 123, and in this case, the formation of the conductive pattern 163 may include anisotropically etching the conductive layer in the second trench 123. Each of the conductive patterns 163 may be locally formed in the corresponding one of the recess regions 151 that may be provided with the horizontal insulating patterns 161.

Figure 10:
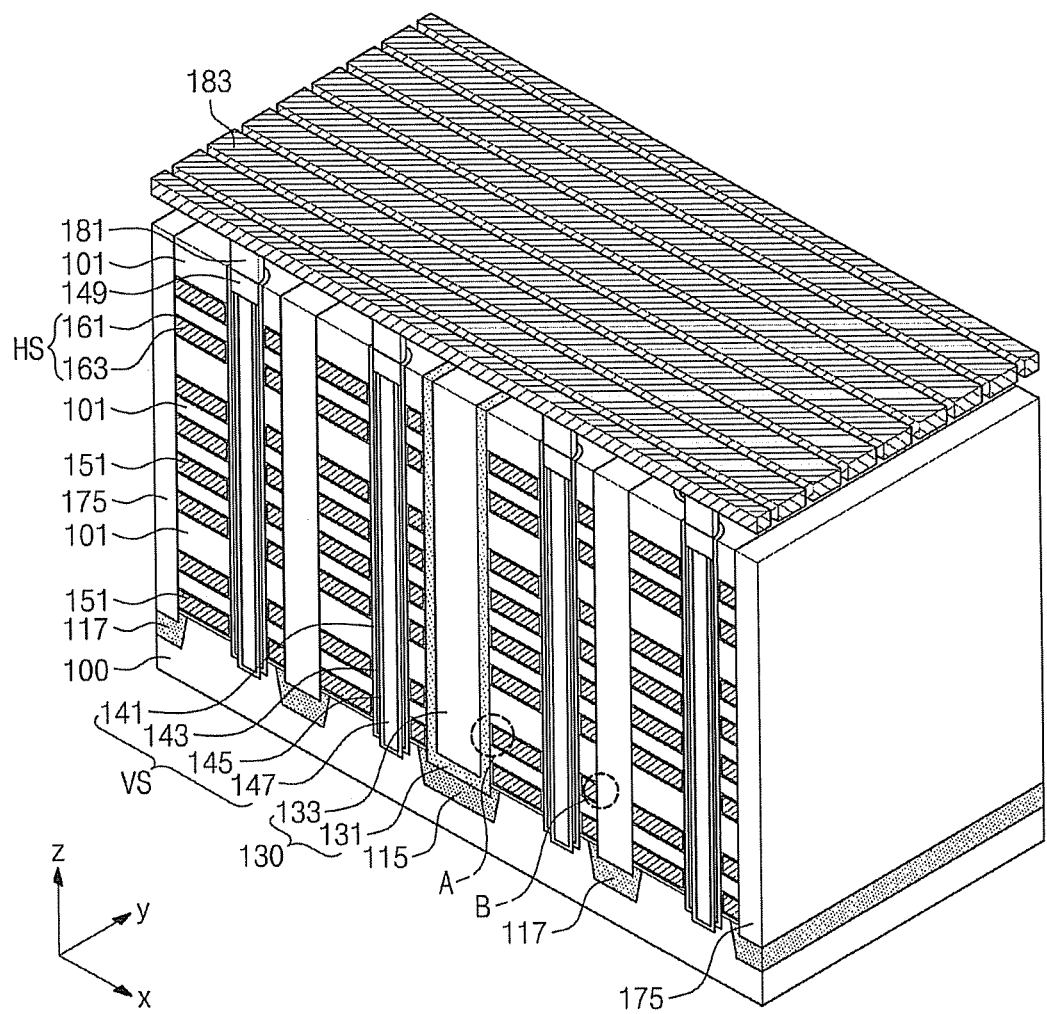

Referring to FIG. 10, a second vertical insulating separator 175 may be formed to fill the second trenches 123. The formation of the second vertical insulating separator 175 may include forming a second separation layer to fill the second trenches 123 and planarizing the second separation layer to expose a top surface of the mold structure 110m. The second separation layer may be an insulating layer formed by a spin-on-glass technique and/or a silicon oxide. The second vertical insulating separator 175 may be in direct contact with sidewalls of the conductive patterns 163 exposed by the second trenches 123, as illustrated in FIG. 11B.

Upper plugs 181 may be formed on the vertical structures VS, respectively, and upper interconnection lines 183 may be formed on the upper plugs 181 to connect the upper plugs 181 with each other. According to some example embodiments, the upper plugs 181 may be formed of one of doped silicon and metallic materials. According to other example embodiments, the upper plugs 181 may be a silicon layer doped with impurities of a different conductivity type from the semiconductor pattern. In this case, the upper plug 181 and the semiconductor pattern may form a rectifying element, for example, a pn diode. Each of the upper interconnection lines 183 may be electrically connected to the semiconductor pattern via the upper plug 181 and may be formed to cross the horizontal structures HS. According to example embodiments of a NAND flash memory device, the upper interconnection lines 183 may be used as bit lines that may be connected to one end of a plurality of cell strings. According to some example embodiments, contact plugs may be formed to penetrate the first vertical insulating separator 130. The contact plugs may be ohmically connected to the first doped region 115 and/or the substrate 100.

Hereinafter, a three-dimensional semiconductor device, according to some example embodiments of the inventive concepts will be described with reference to FIGS. 10, 11A and 11B, and the three-dimensional semiconductor device according to other example embodiments of the inventive concepts will be described in more detail with reference to FIGS. 12-15. Referring to FIGS. 10-15, the three-dimensional semiconductor memory device may include a plurality of memory blocks on a substrate 100. A first doped region 115 may be in the substrate 100 between the memory blocks. First vertical insulating separator 130, 130a, 130b or 130c may be disposed between the memory blocks. Each of the memory blocks may include a plurality of electrode structures, and second doped regions 117 may be in the substrate 100 between the electrode structures.

According to some example embodiments, an impurity concentration of the second doped region 117 may be less than that of a first doped region 115. The electrode structure may include insulating patterns 101 and the conductive patterns 163 alternatingly stacked on the substrate 100. A second vertical insulating separator 175 may be disposed between the electrode structures. At least one of the electrode structures may be between the first vertical insulating separators 130, 130a, 130b or 130c and the second vertical insulating separator 175. And, at least one of the electrode structures may be disposed between the second vertical insulating separators 175. The first vertical insulating separators 130, 130a, 130b or 130c may be between adjacent pairs of the second vertical insulating separators 175. According to some example embodiments, a horizontal or x-directional width of the first vertical insulating separator 130, 130a, 130b or 130c may be greater than that of the second vertical insulating separator 175.

According to some example embodiments, the first vertical insulating separator 130 or 130a may include the insulating gap-fill layer 133 and the etch stop layer 131 between the insulating gap-fill layer 133 and the electrode structure. The etch stop layer 131 may be an insulating material with etch selectivity to the insulating patterns 101 of the electrode structure. According to some example embodiments, the second vertical insulating separator 175 may be a single layered structure and may be in direct contact with one sidewall of the conductive patterns 163, as illustrated in FIG. 11B.

The etch stop layer 131 may extend from sidewalls of the electrode structure to cover the top surface of the first doped region 115, as illustrated in FIG. 10. According to other example embodiments, the etch stop layer 131 may be locally formed between the insulating patterns 101 and the insulating gap-fill layer 133, as illustrated in FIGS. 12 and 13A. As illustrated in FIG. 13b, the etch stop layer 131 may be thicker in a region adjacent to the insulating pattern than in another region adjacent to the conductive pattern 163.

According to some example embodiments, as illustrated in FIG. 14, the first vertical insulating separator 130b may include a plurality of layers 135, 137 and 139 that may sequentially cover the first trench 121. At least one of the layers 135, 137 and 139 may be include a material with etch selectivity with respect to the others. For example, the first vertical insulating separator 130b may be a structure including an oxide layer, a nitride layer, and an oxide layer that are sequentially stacked. According to other example embodiments, as illustrated in FIG. 15, the first vertical insulating separators 130c may be a single layer including the same material as the insulating layers 101 of the mold structure 110m.

The three-dimensional semiconductor memory device according to example embodiments of the inventive concepts may include vertical structures VS intersecting the upper interconnection lines 183. The vertical structures VS may penetrate the electrode structure and may be connected to the substrate 100. Each of the vertical structures VS may include a semiconductor pattern that may be connected to the top surface of the substrate 100 and a vertical insulating pattern 141 that may be between the semiconductor pattern and the horizontal structures HS. According to some example embodiments, the semiconductor pattern may include a semiconductor spacer 143 and a semiconductor body portion 145. The semiconductor spacer 143 may be shaped like a cylindrical shell with open ends, and the semiconductor body portion 145 may be shaped like a cup with portions that may be covering the inner wall of the semiconductor spacer 143 and the top surface of the substrate 100. The semiconductor body portion 145 may be formed to a thickness that does not completely fill the openings 140. The gap-filling layer 147 may fill a region, which may not be occupied by the semiconductor body portion 145.

The semiconductor body portion 145 and/or the semiconductor spacer 143 may be of different crystal structures than polycrystalline silicon that may be formed through CVD, after undergoing a crystalline structure changing step (e.g., an epitaxial technique including a laser annealing step). For example, the semiconductor body portion 145 and/or the semiconductor spacer 143 may include a bottom region and a top region of different grain sizes. The semiconductor body portion 145 and/or the semiconductor spacer 143 according to example embodiments may have the technical features that may be related to the crystal structure differences or similarities.

The upper doped region 149 may be formed in the uppermost portion of the semiconductor pattern. In some example embodiments, the upper doped region 149 may have a bottom surface that may be located at a level higher than the top surface of the uppermost one of the horizontal structures HS. The upper doped region 149 may be doped with impurities that may have a different conductivity type from the remaining portion of the semiconductor pattern. The upper doped region 149 and the remaining portion of the semiconductor pattern may constitute a rectifying device, for example, a diode.

The vertical insulating pattern 141 may be shaped like a cylindrical shell with open ends and may include the bottom portion disposed below the semiconductor spacer 143. The vertical insulating pattern 141 may extend vertically from regions between the semiconductor pattern and the horizontal structures HS. For example, the entire outer surface of the semiconductor pattern may be covered with the vertical insulating pattern 141 provided as a single body. According to some example embodiments, the semiconductor pattern may be one material with a semiconductor property. For example, each of the semiconductor spacer 143 and the semiconductor body portion 145 may be one of a polysilicon layer, an organic semiconductor layer, and/or carbon nano structures. The vertical insulating pattern 141 may include one or more layers. In some example embodiments, the vertical insulating pattern 141 may include a tunnel insulating layer that may constitute a memory element of a charge trap type nonvolatile memory transistor.

A horizontal insulating pattern 161 may be interposed between the conductive patterns 163 and the vertical structure VS. The horizontal insulating pattern 161 may horizontally extend from a sidewall of the vertical structure VS to cover the top and bottom surfaces of the conductive pattern 163. According to some example embodiments, the horizontal insulating pattern 161 may include a blocking insulation layer that may serve as part of the memory element of the charge trap type nonvolatile memory transistor. According to some example embodiments, the horizontal insulating pattern 161 may be in direct contact with the vertical insulating pattern 141 and/or a portion of the first vertical insulating separator 130, 130a, 130b or 130c. For example, the horizontal insulating pattern 161 may be in direct contact with the etch stop layer 131 that may be in the first trench 121, as illustrated in FIGS. 11A and 13B. According to other example embodiments, the horizontal insulating pattern 161 may be in direct contact with the insulating gap-fill layer 133 of the first vertical insulating separator 130a, as illustrated in FIG. 13A.

FIGS. 16-23 are perspective diagrams of data storing layers according to example embodiments of the inventive concepts. According to example embodiments of the inventive concepts, a three-dimensional semiconductor memory device may be a three-dimensional FLASH memory device. A three-dimensional flash memory device may include a data storing layer with a tunnel insulating layer TIL, a charge storing layer CL and a first blocking insulation layer BIL1 between the semiconductor pattern SP and the conductive pattern 163. The data storing layer may include at least one of the vertical and horizontal insulating patterns according to example embodiments. According to some example embodiments, the data storing layer may further include a second blocking insulation layer BIL2 that may be interposed between the first blocking insulation layer BIL1 and the conductive pattern 163. The data storing layer may include a capping layer CPL between the charge storing layer CL and the first blocking insulation layer BIL1 Layers of the data storing layer may be formed using a deposition technique providing, for example, excellent and/or improved step coverage property (e.g., a CVD and/or ALD technique).

Figure 19:
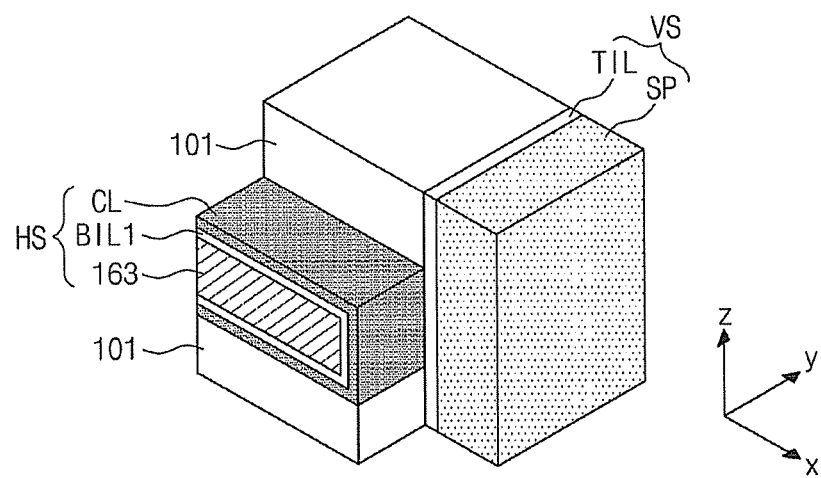
Figure 18:
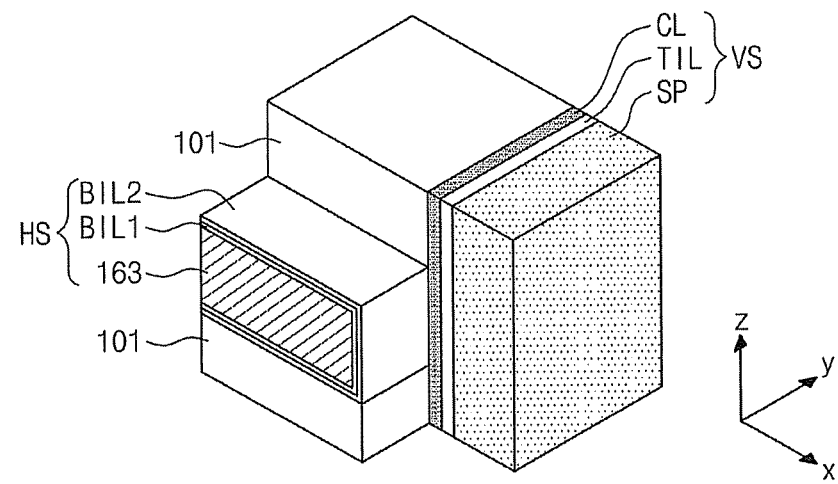
Figure 20:
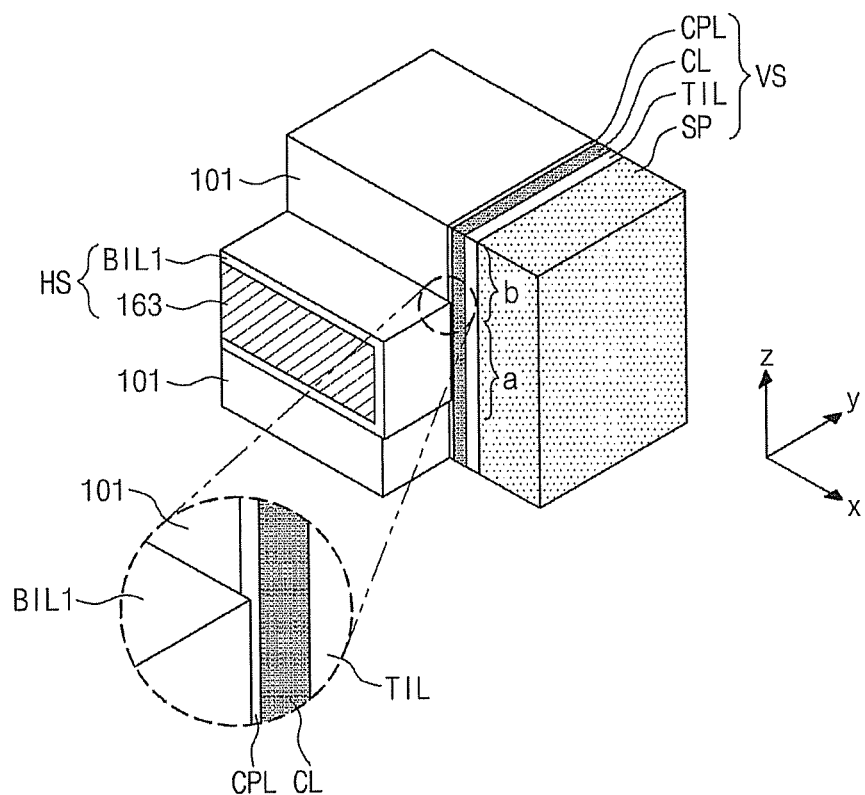

The vertical structure VS may include the tunnel insulating layer TIL and the horizontal structure HS may include at least one of the first and second blocking insulating layers BIL1 and BIL2. According to example embodiments (e.g., as illustrated in FIGS. 16, 17, 19, 21, 22 and 23), the vertical structure VS may include the charge storing layer CL. According to example embodiments (e.g., as illustrated in FIGS. 18 and 20), the horizontal structure HS may include the charge storing layer CL. If the vertical structure VS includes the charge storing layer CL (e.g., as illustrated in FIGS. 16, 21, 22, and 23) the vertical structure VS may include the capping layer CPL. The vertical structure VS and the horizontal structure HS may directly contact without the capping layer CPL (e.g., as illustrated in FIGS. 19 and 20).

Figure 16:
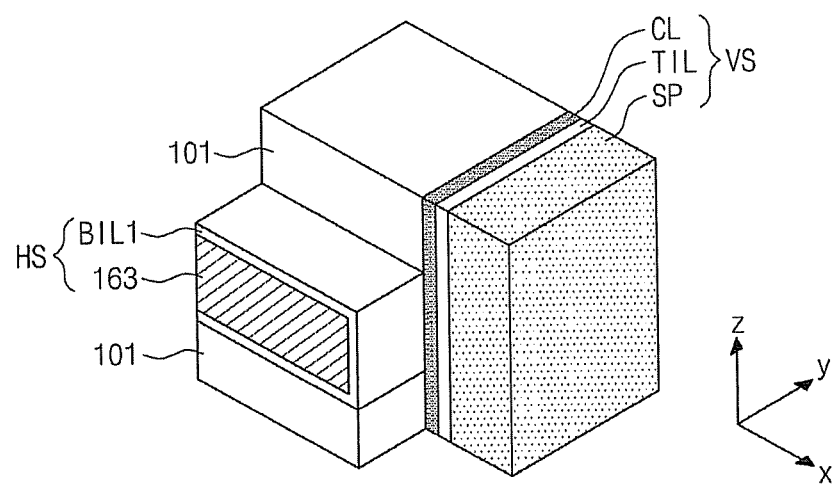
Figure 21:
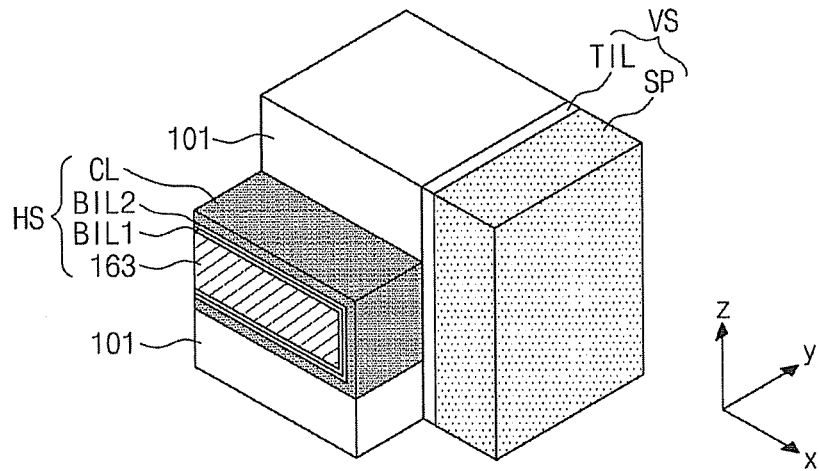
Figure 22:
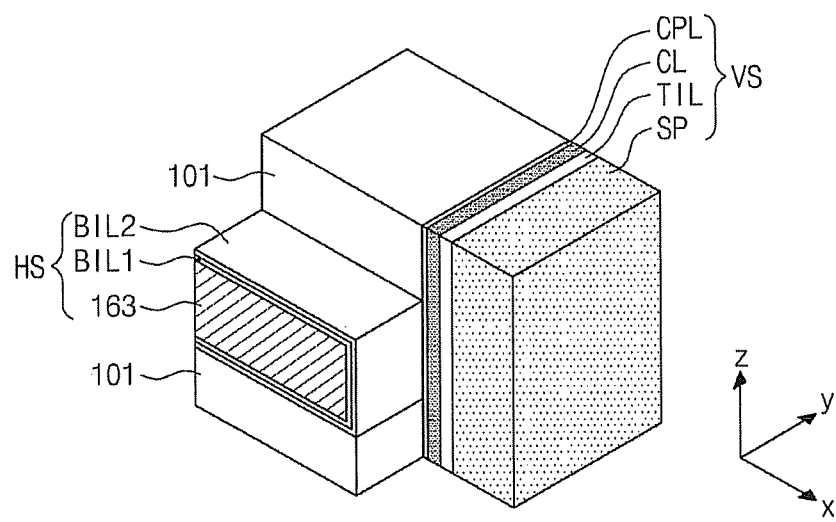

The sidewall thickness of the capping layer CPL may be non-uniform. For example, during the forming of the recess regions 151, the sidewall of the capping layer CPL adjacent to the horizontal structure HS may be horizontally recessed. The thickness of the capping layer CPL may be thicker in a region "b" (or a vertical adjacent region) between the horizontal structures HS than in a region "a" (or a channel region) that may be adjacent to the horizontal structure HS (e.g., as illustrated in FIG. 21). The capping layer CPL may locally remain on the vertical adjacent region "b", and the horizontal structure HS may directly contact the sidewall of the charge storing layer CL in the channel region "a" (e.g., as illustrated in FIG. 22). The sidewall thickness of the capping layer CPL may be substantially uniform (e.g., as illustrated in FIGS. 16 and 23).

Figure 23:
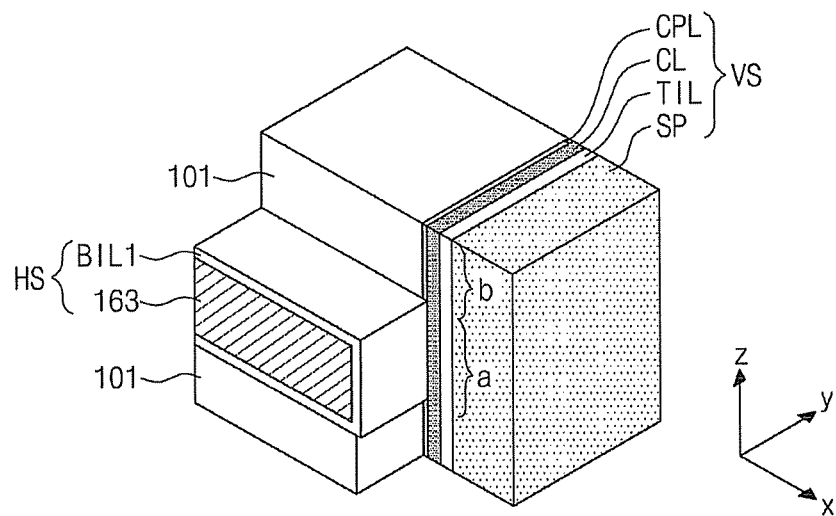

According to some example embodiments, the horizontal structure HS may include both of the first and second blocking insulating layers BIL1 and BIL2 (e.g., as illustrated in FIGS. 19, 20 and 23). The charge storing layer CL may be one or more insulating layers with abundant trap sites and/or one or more insulating layers with nano particles and may be formed, for example, by CVD and/or ALD. For example, the charge storing layer CL may include one of a trap insulating layer, a floating gate electrode, and/or an insulating layer with conductive nano dots. The charge storing layer CL may include, for example, a silicon nitride layer, a silicon oxynitride layer, a silicon-rich nitride layer, a nano crystalline silicon layer, and/or a laminated trap layer.

The tunnel insulating layer TIL may be a material with a higher band gap than the charge storing layer CL, and may be formed by, for example, CVD and/or ALD. For example, the tunnel insulating layer TIL may be a silicon oxide layer and/or a silicon oxynitride layer. The tunnel insulating layer TIL may undergo a thermal treatment that may be performed after a deposition process. The thermal treatment process may be, for example, a rapid thermal nitridation (RTN) process and/or an annealing process in an atmosphere that may include nitrogen and/or oxygen. The first and second blocking insulating layers BIL1 and BIL2 may be different materials, and one of them may be a material with a smaller band bap than the tunnel insulating layer TIL and a larger band gap than the charge storing layer CL. The first and second blocking insulating layers BIL1 and BIL2 may be formed by, for example, CVD and/or ALD.

At least one of the first and second blocking insulating layers BIL1 and BIL2 may be formed by an annealing process performed in an atmosphere that may include nitrogen and/or oxygen and/or a wet oxidation. According to example embodiments, the first blocking insulating layer BIL1 may be a high-k dielectric layer (e.g., an aluminum oxide layer and/or a hafnium oxide layer). The second blocking insulating layer BIL2 may be, for example, a material with a smaller dielectric constant than the first blocking insulating layer BIL1. According to example embodiments, the second blocking insulating layer BIL2 may be a high-k dielectric layer and the first blocking insulating layer BIL1 may be of a material with a smaller dielectric constant than the second blocking insulating layer BIL2. According to example embodiments, a third blocking insulating layer (not illustrated) may be between the charge storing layer CL and the conductive pattern 163.

The capping layer CPL may be a material with etch selectivity to the charge storing layer CL and/or the sacrificial layer 102. For example, if the sacrificial layer 102 may be a silicon nitride layer, the capping layer CPL may be a silicon oxide layer. During a process for removing the sacrificial layer 102 to form recess regions 151, the capping layer CPL may serve as an etch stop layer to prevent and/or reduce etch damage of the charge storing layer CL. If a capping layer CPL remains between the conductive pattern 163 and the charge storing layer CL (e.g., as illustrated in FIGS. 16, 21, 22 and 23), the capping layer CPL may be a material contributing to preventing or reducing leakage (e.g., back-tunneling) of charge stored in the charge storing layer CL. For example, the capping layer CPL may be one of a silicon oxide layer and a high-k dielectric layer.

Figure 24:
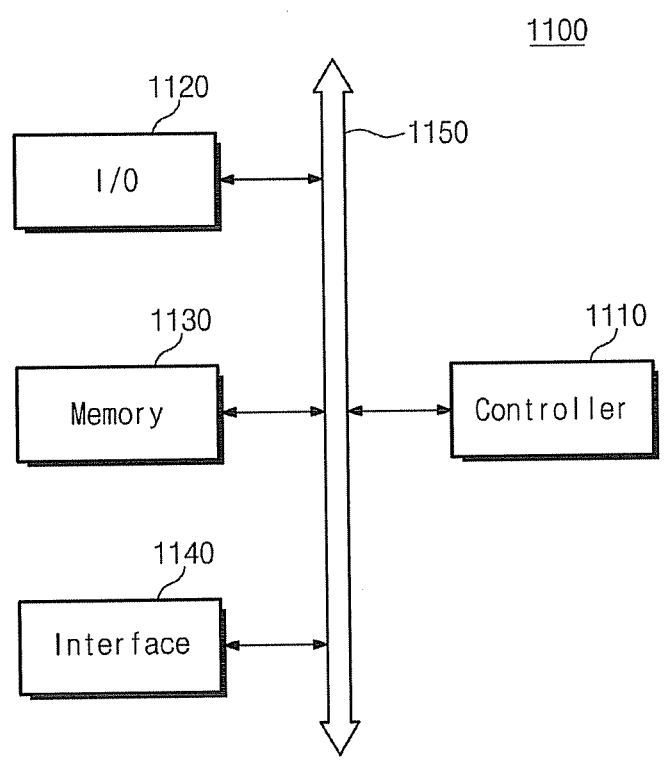

FIG. 24 is a block diagram illustrating memory systems including three-dimensional semiconductor memory devices according to example embodiments of the inventive concepts. Referring to FIG. 24, a memory system 1100 may be applied to a PDA (personal digital assistant), a portable computer, a web tablet, a wireless phone, a mobile phone, a digital music player, a memory card and/or all the devices that can, transmit and/or receive data in a wireless communication environment. The memory system 1100 may include a controller 1110, an input/output device 1120 (e.g., a keypad and/or a display device), a memory 1130, an interface 1140 and a bus 1150. The memory 1130 and the interface 1140 may communicate with each other through the bus 1150.

The controller 1110 may include a microprocessor, a digital signal processor, a micro controller and/or other process devices similar to the microprocessor, the digital signal processor and the micro controller. The memory 1130 may be used to store an instruction executed by the controller 1110. The input/output device 1120 may receive data and/or a signal from the outside of the system 1100 and/or transmit data and/or a signal to the outside of the system 1100. For example, the input/output device 1120 may include a keyboard, a keypad and/or a displayer. The memory 1130 may include the nonvolatile memory device according to example embodiments described with respect to FIGS. 1-23. The memory 1130 may further include a different kind of memory, a volatile memory device capable of random access and various kinds of memories. The interface 1140 may transmit data to a communication network and/or may receive data from a communication network.

Figure 25:
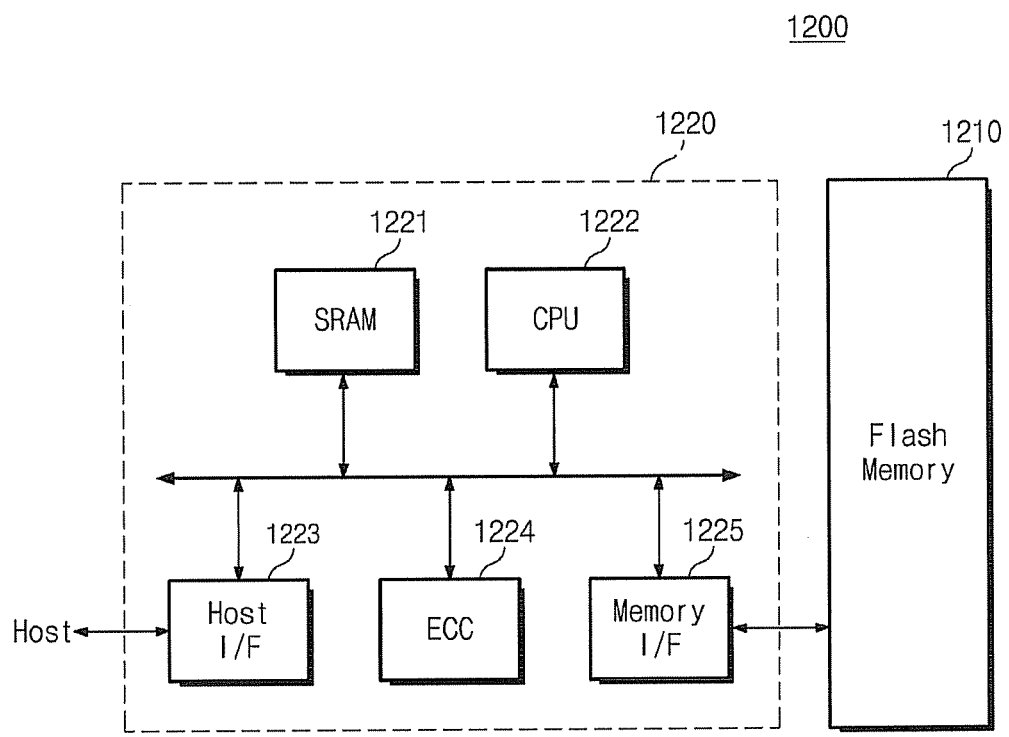

FIG. 25 is a block diagram illustrating memory cards including three-dimensional semiconductor memory devices according to example embodiments of the inventive concepts. Referring to FIG. 25, a memory card 1200 for supporting a storage capability of a large capacity may be fitted with a semiconductor memory device 1210 according to example embodiments of the inventive concepts described with respect to FIGS. 1-23. The memory card 1200 according to example embodiments of the inventive concepts may include a memory controller 1220 that may control every data exchange between a host and the semiconductor memory device 1210.

A static random access memory (SRAM) 1221 may be used as an operation memory of a processing unit 1222. A host interface 1223 may include data exchange protocols of a host that may be connected to the memory card 1200. An error correction block 1224 may detect and/or may correct errors that may be included in data readout from a multi bit semiconductor memory device 1210. A memory interface 1225 may interface with the semiconductor memory device 1210 of at least some example embodiments. The processing unit 1222 may perform every control operation for exchanging data of the memory controller 1220. Even though not depicted in drawings, it may be apparent to one of ordinary skill in the art that the memory card 1200 according to example embodiments of the inventive concepts described with respect to FIGS. 1-23 may include a ROM (not illustrated) storing code data for interfacing with the host.

Figure 26:
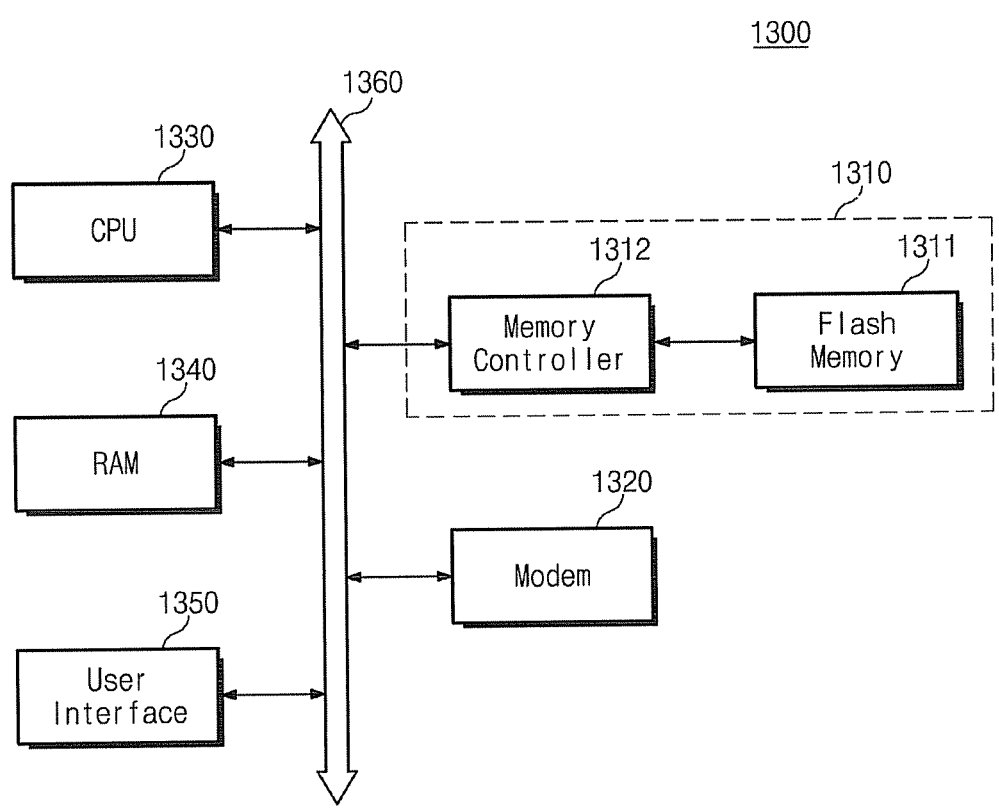

FIG. 26 is a block diagram illustrating information processing systems including three-dimensional semiconductor memory devices according to example embodiments of the inventive concepts. Referring to FIG. 26, an information processing system 1300 may include a 3D semiconductor memory system 1310 including a 3D semiconductor memory device according to example embodiments of the inventive concepts described with respect to FIG. 26. The semiconductor memory system 1310 may be mounted to an information processing system, for example, a mobile device and/or a desktop computer. The information processing system 1300 may also includes a modem 1320, a central processing unit (CPU) 1330, a RAM 1340, and a user interface 1350, that may be electrically connected to a system bus 1360. The semiconductor memory system 1310 may be configured similarly to that described with respect to FIG. 25, and may include a 3D semiconductor memory device 1311, and a memory controller 1312. A memory system 1310 may be a solid state drive SSD, and data that may be processed by the CPU 1330 and/or input from the outside may be stored in the SSD.

An information processing system 1300 configured as described and including a 3D semiconductor memory device may reliably store a large amount of data in the semiconductor memory system 1310. The semiconductor memory system 1310 may conserve resources for error correction and a high speed data exchange function may be provided. Although not illustrated in the drawing, it may be apparent to those of ordinary skill in the art that the information processing system 1300 may also include an application chipset, a camera image processor (CIS) and/or an input/output device.

Furthermore, a semiconductor memory device and/or memory system that may include the same may be packaged in various kinds of ways. For instance, the semiconductor memory device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

The package in which the semiconductor memory device according to one of the above example embodiments may be mounted may further include at least one semiconductor device (e.g., a controller and/or a logic device) that may control the semiconductor memory device.

According to example embodiments of the inventive concepts, a mold structure may be formed to have the substantially the same horizontal width as conductive patterns, before forming the vertical structure to penetrate the conductive patterns. This may facilitate suppression of the mold structure from being deformed due to a subsequent thermal process, and/or to prevent or reduce the vertical structure from being misaligned with respect to the conductive patterns. A three-dimensional semiconductor memory device according to example embodiments of the inventive concepts may be fabricated with a high capacity and improved reliability.

While example embodiments of the inventive concepts have been particularly illustrated and described, it will be understood by one of ordinary skill in the art that variations in form and detail may be made therein without departing from the spirit and scope of the attached claims.

What is claimed is:

1. A method of fabricating a three-dimensional semiconductor, comprising:
    forming a stack structure on a substrate, the stack structure including a plurality of insulating layers and a plurality of sacrificial layers, the insulating layers alternating with the sacrificial layers;
    forming at least one first trench and a plurality of second trenches, the first and second trenches separating the stack structure into a plurality of mold structures, the at least one first trench between the second trenches;
    forming first vertical insulating separators in the first and second trenches;
    forming semiconductor patterns penetrating the mold structure, the semiconductor patterns being spaced apart from the first and second trenches;
    removing the first vertical insulating separator from the second trench to expose the sacrificial layers;
    removing the sacrificial layers exposed by the second trench to form recess regions partially exposing the semiconductor patterns and the first vertical insulating separators; and
    forming conductive patterns in the recess regions.

2. The method of claim 1, wherein the forming first vertical insulating separators includes
    forming a conformal etch stop layer covering surfaces inside the first and second trenches; and
    forming an insulating gap-fill layer on the etch stop layer in the first and second trenches.

3. The method of claim 2, wherein the etch stop layer includes an insulating material with etch selectivity to the sacrificial layers and the insulating layers.

4. The method of claim 2, wherein the removing the sacrificial layers includes etching a sidewall of the etch stop layer to partially expose the insulating gap-fill layer.

5. The method of claim 2, further comprising:
    forming second vertical insulating separators filling the second trenches after the forming conductive patterns.

6. The method of claim 5, wherein each of the second vertical insulating separators is a single layer formed of a different material than a material of the etch stop layer.

7. The method of claim 1, wherein a width of the first trench is greater than a width of the second trench.

8. The method of claim 1, wherein a horizontal width of each of the mold structures is substantially a same horizontal width.

9. The method of claim 1, wherein the removing the first vertical insulating separator from the second trench includes
    forming a mask pattern on the mold structures to cover the first trench and expose the second trenches; and
    removing the first vertical insulating separator from each of the second trenches.

10. The method of claim 1, further comprising:
    forming a horizontal insulating layer to cover the recess regions before the forming conductive patterns, the horizontal insulating layer in contact with the semiconductor patterns and the first vertical insulating separators.

11. The method of claim 8, further comprising:
    forming a vertical insulating layer penetrating the mold structure before the forming semiconductor patterns,
    wherein at least one of the vertical and horizontal insulating layers includes a data storing layer.

12. The method of claim 1, wherein a horizontal width of each of the conductive patterns is a substantially same horizontal width as a corresponding one of the mold structures.

13. The method of claim 1, further comprising:
    forming a first doped region in the substrate below the first trench; and
    forming a second doped region in the substrate below the second trench,
    wherein the second doped region is a different conductivity type from the first doped region.

14. The method of claim 13, wherein
    the first doped region is a same conductivity type as the substrate, and
    an impurity concentration of the first doped region is greater than an impurity concentration of the substrate.

15. A method of manufacturing a memory card, comprising:
    forming a controller;
    forming a semiconductor device, the forming a semiconductor device including the method of fabricating a three-dimensional semiconductor device of claim 1;
    forming an interface; and
    forming a bus connecting the controller, the semiconductor device, and the interface.

* * * * *